(12) United States Patent
Nakamura et al.

(10) Patent No.: US 8,431,943 B2
(45) Date of Patent: Apr. 30, 2013

(54) LIGHT TRANSMITTING SUBSTRATE, METHOD FOR MANUFACTURING LIGHT TRANSMITTING SUBSTRATE, ORGANIC LED ELEMENT AND METHOD FOR MANUFACTURING ORGANIC LED ELEMENT

(75) Inventors: Nobuhiro Nakamura, Tokyo (JP); Motoshi Ono, Tokyo (JP); Kenji Imakita, Tokyo (JP); Hidefumi Odaka, Tokyo (JP); Nao Ishibashi, Tokyo (JP); Kazutaka Hayashi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 112 days.

(21) Appl. No.: 12/775,971

(22) Filed: May 7, 2010

(65) Prior Publication Data

US 2010/0230667 A1 Sep. 16, 2010

Related U.S. Application Data

(63) Continuation of application No. PCT/JP2008/070239, filed on Nov. 6, 2008.

(30) Foreign Application Priority Data

Nov. 9, 2007 (JP) .............................. P2007-292522

(51) Int. Cl.
*H01L 33/00* (2010.01)
(52) U.S. Cl.
USPC 257/98; 257/40; 257/E51.018; 257/E33.074; 438/29; 438/37

(58) Field of Classification Search .................. None
See application file for complete search history.

(56) References Cited

U.S. PATENT DOCUMENTS

| 7,531,955 B2 * | 5/2009 | Cok et al. ..................... 313/501 |
| 8,018,140 B2 * | 9/2011 | Nakamura et al. ............ 313/503 |
| 2004/0207314 A1 | 10/2004 | Aitken et al. |

(Continued)

FOREIGN PATENT DOCUMENTS

| EP | 2 178 343 A1 | 4/2010 |
| JP | 2931211 B2 | 5/1999 |

(Continued)

OTHER PUBLICATIONS

Translation of PCT Written Opinion (Jun. 11, 2008).*

(Continued)

*Primary Examiner* — Jarrett Stark
(74) *Attorney, Agent, or Firm* — Foley & Lardner LLP

(57) ABSTRACT

The present invention is intended to provide an organic LED element in which the extraction efficiency is improved up to 80% of emitted light, and provides a translucent substrate comprising a translucent glass substrate; a scattering layer formed on the glass substrate and comprising a glass which contains a base material having a first refractive index for at least one wavelength of light to be transmitted and a plurality of scattering materials dispersed in the base material and having a second refractive index different from that of the base material; and a translucent electrode formed on the scattering layer and having a third refractive index higher than the first refractive index, wherein distribution of the scattering materials in the scattering layer decreases toward the translucent electrode.

17 Claims, 15 Drawing Sheets

U.S. PATENT DOCUMENTS

| | | | |
|---|---|---|---|
| 2005/0007000 A1 | 1/2005 | Chou et al. | |
| 2006/0049745 A1 | 3/2006 | Handa et al. | |
| 2006/0186801 A1 | 8/2006 | West | |
| 2007/0013291 A1* | 1/2007 | Cok et al. | 313/501 |
| 2007/0053063 A1 | 3/2007 | Adachi et al. | |
| 2008/0218068 A1* | 9/2008 | Cok | 313/505 |
| 2008/0237612 A1* | 10/2008 | Cok | 257/88 |
| 2009/0153972 A1* | 6/2009 | Nakamura et al. | 359/599 |
| 2010/0187987 A1* | 7/2010 | Nakamura | 313/504 |
| 2010/0230667 A1* | 9/2010 | Nakamura et al. | 257/40 |
| 2011/0001159 A1* | 1/2011 | Nakamura et al. | 257/98 |
| 2011/0180308 A1* | 7/2011 | Nakamura et al. | 174/255 |
| 2011/0278622 A1* | 11/2011 | Wada et al. | 257/98 |
| 2011/0278635 A1* | 11/2011 | Nakamura et al. | 257/99 |
| 2011/0284907 A1* | 11/2011 | Nakamura et al. | 257/98 |
| 2012/0025245 A1* | 2/2012 | Nakamura et al. | 257/98 |

FOREIGN PATENT DOCUMENTS

| | | |
|---|---|---|
| JP | 2004-513483 | 4/2004 |
| JP | 2004-513483 A | 4/2004 |
| JP | 2004-513484 A | 4/2004 |
| JP | 2004-319331 A | 11/2004 |
| JP | 2005-038681 A | 2/2005 |
| JP | 2005-063704 | 3/2005 |
| JP | 2005-063704 A | 3/2005 |
| JP | 2006-208985 | 3/2005 |
| JP | 2005-190838 | 7/2005 |
| JP | 2005-190838 A | 7/2005 |
| JP | 2005-190931 A | 7/2005 |
| JP | 2005-251489 A | 9/2005 |
| JP | 2006-222028 | 8/2006 |
| JP | 2006-222028 A | 8/2006 |
| JP | 2007-059195 | 3/2007 |
| JP | 2007-059195 A | 3/2007 |
| JP | 2007-65523 | 3/2007 |
| JP | 2007-065523 A | 3/2007 |
| JP | 2007-141728 | 6/2007 |
| JP | 2007-141728 A | 6/2007 |
| WO | WO 02/37580 A1 | 5/2002 |

OTHER PUBLICATIONS

International Search Report mailed Dec. 9, 2008 received in PCT/JP2008/070239.

Supplementary European Search Report EP Application No. 08848564.4 dated Jan. 21, 2013.

* cited by examiner

LIGHT EMISSION

LIGHT TRANSMITTING SUBSTRATE, METHOD FOR MANUFACTURING LIGHT TRANSMITTING SUBSTRATE, ORGANIC LED ELEMENT AND METHOD FOR MANUFACTURING ORGANIC LED ELEMENT

TECHNICAL FIELD

The present invention relates to a translucent substrate, a process for producing the same, an organic LED element and a process for producing the same, and particularly relates to a light-extraction structure of an organic LED (organic light emitting diode) or the like.

BACKGROUND ART

An organic LED element is one in which an organic layer is put between electrodes, and a voltage is applied between the electrodes to inject holes and electrons, which are allowed to be recombined in the organic layer, thereby extracting light that a light-emitting molecule emits in the course of transition from an excited state to a ground state, and has been used for display, backlight and lighting applications.

The refractive index of the organic layer is from about 1.8 to about 2.1 at 430 nm. On the other hand, the refractive index, for example, at the time when ITO (indium tin oxide) is used as a translucent electrode layer is generally from about 1.9 to about 2.1, although it varies depending on the ITO film-forming conditions or composition (Sn—In ratio). Like this, the organic layer and the translucent electrode layer are close to each other in refractive index, so that emitted light reaches an interface between the translucent electrode layer and a translucent substrate without totally reflecting between the organic layer and the translucent electrode layer. A glass or resin substrate is usually used as the translucent substrate, and the refractive index thereof is from about 1.5 to about 1.6, which is lower in the refractive index than the organic layer or the translucent electrode layer. Considering Snell's law, light which tries to enter the glass substrate at a shallow angle is reflected by total reflection in an organic layer direction, and reflected again at a reflective electrode to reach the interface of the glass substrate again. At this time, the incident angle to the glass substrate does not vary, so that reflection is repeated in the organic layer and the translucent electrode layer to fail to extract the light from the glass substrate to the outside. According to an approximate estimate, it is known that about 60% of the emitted light cannot be extracted by this mode (organic layer-translucent electrode layer propagation mode). The same also occurs at an interface between the substrate and the air, whereby about 20% of the emitted light propagates in the glass and fails to be extracted (substrate propagation mode). Accordingly, the amount of the light which can be extracted to the outside of the organic LED element is less than 20% of the emitted light in the present circumstances.

Patent Document 1 proposes a structure in which a light scattering layer as a semi-translucent material layer is provided on one surface of a substrate (paragraphs 0039 to 0040). This embodiment proposes a structure in which glass particles are firmly fixed to the surface of the substrate with an acrylic adhesive to perform an aggregation arrangement on the surface of the substrate, thereby providing a light scattering portion between the substrate and an organic EL element.

Further, intending to improve extraction efficiency, Patent Document 2 discloses "an organic EL element comprising a translucent substrate having provided thereon a scattering layer comprising an additional layer composed of a translucent material in which $SiO_2$ particles, resin particles, a metal powder or metal oxide particles are dispersed, by a resin-based adhesive, spraying, vapor deposition, sputtering, dipping, spin coating or the like" (paragraph 0057).

Patent Document 3 discloses a light-emitting device in which a diffusing layer obtained by dispersing at least two kinds of fine particles one digital or more different in average particle size in a resin is provided adjacent to a translucent electrode, thereby efficiently extracting wave-guided light.

Further, Patent Document 4 proposes a technique of preventing total reflection in the inside of a display formed by using a light-emitting device, thereby intending to increase luminance. In Patent Document 4, it is described that "a high diffusion material may be coated on a layer of a light-emitting device such as a substrate, a translucent electrode, an optical film or another component" (Patent Document 4, paragraph 0027). Furthermore, it is described that "for example, particles may be arranged in glass frit, suitably coated, flattened and fired to form a glass substrate or a layer on a glass substrate, which acts as a high diffusion TIR frustrator" (Patent Document 4, paragraph 0027).

Moreover, also in Patent Document 5, there are descriptions similar to those of Patent Document 4 (Patent Document 5, paragraph 0026).

Patent Document 6 proposes a light scattering layer containing a light-transmitting resin layer and plural particles dispersed in the resin layer, on a substrate (paragraph 0013). It is proposed in Patent Document 6 to use an acryl resin as a material of the resin layer.

Patent Document 7 proposes a light scattering layer constituted of an ultraviolet curing resin having a solvent added thereto, on a substrate (paragraph 0029).

Patent Document 8 proposes one in which marking is applied in a translucent substrate such as a glass substrate or a resin substrate by laser, thereby forming a light scattering portion, and proposes that many light scattering portions are provided at the side near a light incidence surface or a light output surface (paragraph 0030).

| | |
|---|---|
| Patent Document 1 | Japanese Patent No. 2931211 |
| Patent Document 2 | JP-A-2005-63704 |
| Patent Document 3 | JP-A-2005-190931 |
| Patent Document 4 | JP-T-2004-513483 |
| Patent Document 5 | JP-T-2004-513484 |
| Patent Document 6 | JP-A-2007-141728 |
| Patent Document 7 | JP-A-2006-222028 |
| Patent Document 8 | JP-A-2005-038681 |

DISCLOSURE OF THE INVENTION

Problems that the Invention is to Solve

However, in Patent Document 1, paraffin or the like is fixed as a semi-translucent material layer onto the substrate with the resin binder (paragraph 0040). Namely, the light scattering portion of Patent Document 1 is the resin, and liable to absorb water. Accordingly, the organic EL device of Patent Document 1 has a problem that it cannot withstand use for a long period of time. Similarly, in Patent Documents 6 and 7, the light scattering layer is constituted of the resin. Therefore, Patent Documents 6 and 7 have the same problem.

Further, Patent Document 2 discloses that the refractive index of the translucent substrate is brought near that of the scattering layer. However, it makes no mention of the relationship between the refractive index of the scattering layer and that of a translucent electrode layer at all. Further, Patent Document 2 discloses that a surface of the scattering layer may be uneven, in a text of the specification.

Further, Patent Documents 4 and 5 suggest use of the glass layer which is decreased in high-temperature degradation and stable, but makes no mention of unevenness of a surface of the scattering layer at all.

When the surface is uneven herein, the unevenness tends to be formed on a surface of a first electrode formed on this upper layer. When a layer having a light emitting function or the like is formed on this upper layer by a vapor deposition method or the like, coatability of the organic layer to the unevenness deteriorates, resulting in the occurrence of variation in thickness of the organic layer. Further, as a result, variation occurs in interelectrode distance between the above-mentioned first electrode and a surface of a second electrode formed on the organic layer. As a result, it has been known that in a region small in interelectrode distance, a large current locally flows through the organic layer to cause an interelectrode short circuit, leading to non-lighting. Furthermore, when a display device constituted by fine pixels such as a high-resolution display is formed, it is necessary to form a fine pixel pattern. There has been a problem that not only the unevenness of the surface contributes to the occurrence of variation in position of pixels and size, but also an organic element is short-circuited by this unevenness.

As described above, none of the above mentioned Patent Documents 1 to 8 has made mention of the flatness (arithmetic average roughness) of the surface of the scattering layer. Further, none of the Patent Documents has shown an example of preparing the scattering layer by glass.

Further, the organic EL element is formed by laminating thin films, so that angular dependency of color is high due to interference, which has also posed a problem that color is not exactly reproduced according to a seeing direction.

Also from such a viewpoint, demand for a translucent substrate having a scattering layer which is thin, high in flatness and further high in refractive index increases.

Patent Document 8 discloses that many light-scattering portions are provided at the side near light incident plane or light outgoing plane, but does not specifically refer to positions thereof. Further, as described in paragraph 0036 of Patent Document 8, laser pulse is concentrated in the inside of a transparent material such as a glass, and damage, change in refractive index, change in density, and the like are caused by a nonlinear effect due to its strong optical electric field. A light-scattering portion is constituted by giving local stress after the formation of a glass material. Further, increase in distribution density of the light scattering portion has the limit, and there is no concept that the light-scattering portions are formed so as to cause scattering uniformly in the plane.

In other words, the disclosure of Patent Document 8 is not a sufficient disclosure that one skilled in the art can carry out, but is merely a disclosure to an extent of describing just a desire. Actually, when the light-scattering portion is formed by laser processing, the refractive index gently changes, so that the refractive index difference at the interface is small. For this reason, in order to form the light-scattering layer having the desired refractive index, laser processing must be conducted with high density. There is, for example, a problem of breakage at the time of laser processing, and it is difficult to obtain the desired distribution. Additionally, a sufficient production yield cannot be obtained, and it was far from the condition to obtain the desired extraction efficiency in the recent laser processing technology. Further, in the case where damage is formed, strength of a glass itself is decreased, and it was difficult to obtain a translucent substrate capable of maintaining strength stably in forming a device or at the time of using the device. Furthermore, when it is tried to form damage portion and refractive index-change portion in the vicinity of the surface of a glass substrate, influence of stress applied at the time of the formation reaches the surface of the glass, and as a result, the substrate breaks during laser processing or strength is remarkably deteriorated. For this reason, the damage portion and the refractive index-change portion must be provided in the inside of the substrate, and as a result, there was a problem that only a glass substrate having a large thickness is applied.

Furthermore, when the glass substrate having a thickness of about 3 mm is used, change portions of damage, refractive index and the like must be provided up to the vicinity of the glass surface in order to secure scattering capability. However, when laser light is concentrated in the vicinity of the surface, possibility of breakage of a glass is high, and generally this is a method unsuitable for a glass plate for used in lighting and display.

Further, in an embodiment of the invention, it is an object to provide a high-strength translucent substrate having a scattering layer excellent in scattering characteristics and having a desired refractive index, while keeping surface smoothness.

Furthermore, in another embodiment of the invention, it is an object to provide a high-efficient, long-life organic LED element by improving light-extraction efficiency.

In addition, in still another embodiment of the invention, it is an object to provide an organic LED element which can inhibit an angular dependency of color.

Further, in another embodiment of the invention, when a reflective electrode is used as an electrode facing to a translucent electrode formed on a translucent substrate, it is an object to provide the translucent substrate and an organic EL element in which the appearance thereof is not spoiled by the occurrence of reflection due to the reflective electrode at the time of non-light emission.

Means for Solving the Problems

Accordingly, the translucent substrate of the invention comprises a translucent glass substrate; a scattering layer formed on the glass substrate and comprising a glass which contains a base material having a first refractive index for at least one wavelength of light to be transmitted and a plurality of scattering materials dispersed in the base material and having a second refractive index different from that of the base material, and a translucent electrode formed on the scattering layer and having a third refractive index higher than the first refractive index, wherein distribution of the scattering materials in the scattering layer decreases toward the translucent electrode in a vicinity of a surface at a translucent electrode side of the scattering layer.

Further, a process for producing a translucent substrate of the present invention comprises steps of: preparing a translucent glass substrate, forming on the glass substrate a scattering layer comprising a base material having a first refractive index for at least one wavelength region of light to be transmitted and a plurality of scattering materials dispersed in the base material and having a second refractive index different from that of the base material; and forming on the scattering layer a translucent electrode having a third refractive index higher than the first refractive index, wherein the scattering layer forming step includes steps of: applying a coating material containing a glass powder onto the glass substrate; and firing the applied glass powder.

The organic LED element of the present invention comprises a translucent glass substrate, a scattering layer formed on the glass substrate and comprising a glass which contains a base material having a first refractive index for at least one wavelength of light to be transmitted and a plurality of scattering materials dispersed in the base material and having a second refractive index different from that of the base material, a translucent electrode formed on the scattering layer and having a third refractive index higher than the first refractive index, an organic layer formed on the translucent electrode, and a reflective electrode formed on the organic layer.

A process for producing an organic LED element of the invention comprises steps of: preparing a translucent glass substrate; forming on the glass substrate a scattering layer comprising a base material having a first refractive index for at least one wavelength of light to be transmitted and a plurality of scattering materials dispersed in the base material and having a second refractive index different from that of the base material; forming on the scattering layer a translucent electrode having a third refractive index higher than the first refractive index, forming an organic layer on the translucent electrode; and forming a reflective electrode on the organic layer.

Advantages of the Invention

According to the invention, the light-extraction efficiency can be improved, and it becomes possible to provide a translucent substrate which can provide an optical device having high extraction efficiency.

Further, scatterability can be increased, so that the angular dependency of color can be decreased.

Furthermore, a scattering layer is constituted by glass, thereby being able to realize stability and high strength, which makes it possible to provide a translucent substrate excellent in scatterability without increasing the thickness compared with an original translucent substrate made of glass.

According to the invention, an organic LED element can be provided in which the extraction efficiency is improved up to 80% of the emitted light.

According to the invention, the first refractive index of the base material may be smaller than the third refractive index of the translucent electrode, so that the degree of freedom in the selection of usable materials is increased. Further, a high refractive index glass is liable to cause devitrification, and is liable to increase costs. However, by using a glass with a low refractive index if only a little, it becomes possible to intend to the improvement of productivity even though light-extraction efficiency is slightly decreased. However, even in this case, a refractive of the base material is desired to be high as possible. Therefore, it is preferred that the base material is a high refractive index glass as possible.

Figure 1:
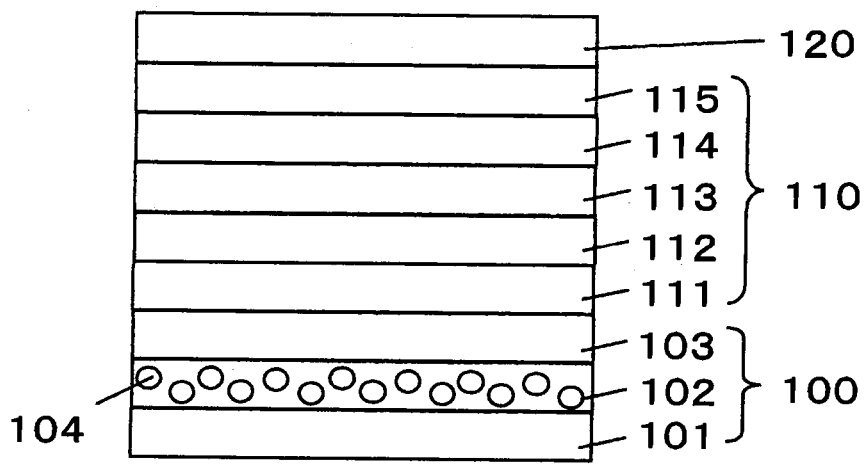
FIG. 1 is a cross-sectional view showing structures of a translucent substrate and an organic LED element of embodiment 1 of the invention.

| | Description of Reference Numerals and Signs |
|---|---|
| 100 | Electrode-Attached Translucent Substrate (Laminate for Organic LED Element) |
| 101 | Glass Substrate |
| 102 | Scattering Layer |
| 103 | Translucent Electrode |
| 104 | Scattering Material |
| 110 | Organic Layer |
| 120 | Reflective Electrode |

BEST MODE FOR CARRYING OUT THE INVENTION

Embodiment 1

The electrode-attached translucent substrate (laminate for an organic LED element) of the invention and the organic LED element being laminated for an organic LED element will be described below with reference to the drawings. FIG. 1 is a cross-sectional view showing structures of the laminate for an organic LED element and the organic LED element being laminated fro an organic LED element.

The organic LED element of the invention comprises an electrode-attached translucent substrate (laminate for an organic LED element) 100, an organic layer 110 and a reflective electrode 120, as shown in FIG. 1. The electrode-attached translucent substrate 100 comprises a substrate 101 comprising a translucent glass substrate, a scattering layer 102 and a translucent electrode 103.

The electrode-attached translucent substrate 100 used in the invention comprises the translucent glass substrate 101, the scattering layer 102 comprising a glass and formed on the glass substrate, and the translucent electrode 103. The scattering layer comprises a base material having a first refractive index at one wavelength of light to be transmitted and a plurality of scattering materials 104 dispersed in the base material and having a second refractive index different from that of the base material. The distribution of the scattering materials in the scattering layer has in-plane uniformity, and additionally decreases from the inside of the scattering layer toward the translucent electrode in the vicinity at the translucent electrode surface side of the scattering layer. The translucent electrode 103 has a third refractive index higher than the first refractive index.

The vicinity at the translucent electrode surface side of the scattering layer means a surface side of a half thickness or more of the scattering layer.

The in-plane uniformity means that the scattering materials are not distributed by pattern formation, but are distributed on the entire plane.

Further, the density $\rho_1$ of the scattering material at a half thickness ($\delta/2$) of the scattering layer 102 comprising a glass and the density $\rho_2$ of the scattering material at a distance x ($\delta/2 < x \leq \delta$) from a surface of the scattering layer on the side facing to the translucent electrode (namely, a surface on the substrate side) satisfy $\rho_1 \geq \rho_2$.

Further, from another standpoint, the density $\rho_3$ of the scattering material at a distance x ($x \leq 0.2$ μm) from the translucent electrode side surface of the scattering layer comprising a glass and the density $\rho_4$ of the scattering material at a distance x=2 μm satisfy $\rho_4 > \rho_3$. This is also clear from FIG. 26, although described later. Further, FIG. 27 shows the case where the firing temperature is 570° C. and 580° C., but similar results could be obtained even when the firing temperature was somewhat changed.

Furthermore, from still another standpoint, the density $\rho_3$ of the scattering material at a distance x ($x \leq 0.2$ μm) from the translucent electrode side surface of the scattering layer comprising a glass and the density $\rho_5$ of the scattering material at a distance x=5 μm satisfy $\rho_3 > \rho_5$. This is also clear from FIG. 27, although described later.

According to this constitution, the probability that pores, precipitated crystals or the scattering material comprising a material different in composition from the base material exists in a surface layer of the scattering layer comprising a glass layer and directly thereunder is lower than in the inside of the scattering layer, so that a smooth surface can be obtained. For this reason, for example, in the case of forming an organic EL element, a surface of the translucent substrate, namely a surface of the scattering layer, is smooth, so that a surface of the translucent electrode (first electrode) formed on this upper layer is smooth. Also in the case of forming a layer having a light-emitting function, or the like on this upper layer by a coating method or the like, the layer having a light-emitting function can be uniformly formed, and the interelectrode distance between the translucent electrode and a surface of the reflective electrode (second electrode) formed on the layer having a light-emitting function becomes uniform. As a result, it does not happen that a large current is locally applied to the layer having a light-emitting function, so that the lifetime can be prolonged. Further, when a display device constituted by fine pixels such as a high-resolution display is formed, it is necessary to form a fine pixel patter. There has been a problem that not only the unevenness of the surface contributes to the occurrence of variation in position of pixels and size, but also an organic EL element is short-circuited by this unevenness. However, the fine pattern can be formed with high accuracy.

Incidentally, although the scattering layer is directly formed on the glass substrate, it may be formed with the interposition of a barrier layer, for example, such that a thin silica film is formed on the glass substrate by a sputtering method or the like, and then scattering layer is formed thereon. However, an extremely stable and flat surface can be obtained by forming the scattering layer comprising a glass with no interposition of an adhesive or an organic layer. Moreover, it becomes possible to form a thermally stable and long-life device by constituting it with only inorganic materials.

Characteristics of such a translucent substrate will be described in detail.

Figure 2:
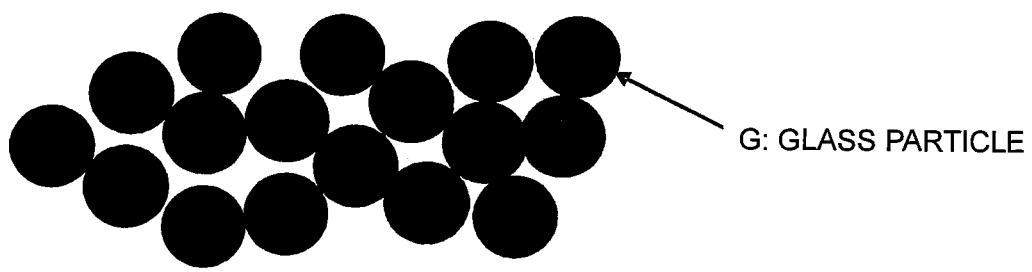
FIG. 2 is a schematic view showing a state of glass particles constituting a scattering layer of the translucent substrate of embodiment 1 of the invention, at the time of coating.

When a glass powder is fired, schematic view of a state in which the glass powder is applied by a suitable method is shown in FIG. 2. A cross section of an outermost portion of a glass layer as the scattering layer constituting the translucent substrate of the invention is shown herein. The distribution state in which the scattering materials are uniformly dispersed over the entire surface is obtained by, for example, dispersing glass particles G in a solvent or a mixture of a resin and a solvent and applying the resulting dispersion to a desired thickness. For example, there are used the glass particles G having a size of about 0.1 to about 10 μm in terms of the maximum length. When the resin and the solvent are mixed, a resin membrane in which the glass particles G are dispersed is heated to decompose the resin, thereby obtaining the state of FIG. 2. FIG. 2 is drawn in a simplified manner, and there is a space between the glass particles.

Figure 3:
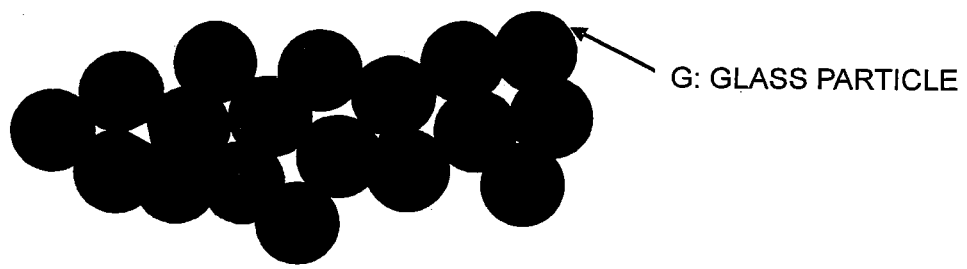
FIG. 3 is a schematic view showing a state of the glass particles constituting a scattering layer of the translucent substrate of embodiment 1 of the invention, at the time of firing.

Supposing that the glass particle size of the glass particles G has distribution, it is conceivable that a structure in which a small glass particle enters the space between the large glass particles G is obtained. When the temperature is further increased, the glass particles starts to be fused to one another at a temperature 10° C. to 20° C. lower than the softening temperature of the glass. A state at this time is shown in FIG. 3. When the glass particles are fused to one another, the space formed between the glass particles of FIG. 2 is deformed by softening of the glass to form a closed space in the glass. The glass particles are fused to one another, whereby outermost layers of the glass particles form an outermost surface of the scattering layer 102 (glass layer). On the outermost surface 200, the space which does not form the closed space is present as a depression.

Figure 4:
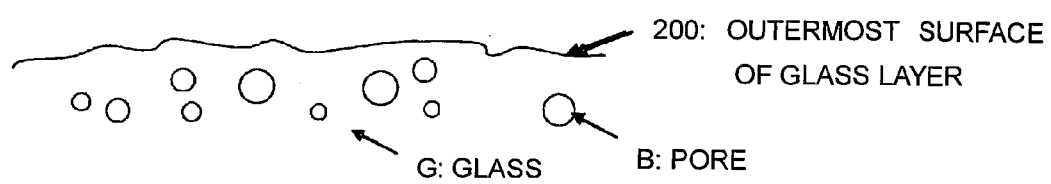
FIG. 4 is a schematic view showing a state of a scattering layer at times when fired at a temperature lower than the softening temperature of the glass as a comparative example of the invention.
Figure 5:
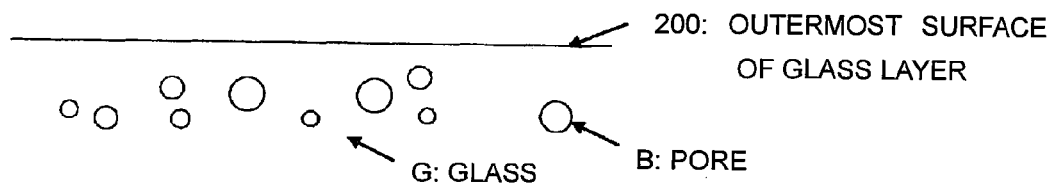
FIG. 5 is a schematic view showing a state of the scattering layer (when fired at a temperature sufficiently higher than the softening temperature of the glass) of embodiment 1 of the invention.

When the temperature is further increased, softening and fluidity of the glass proceed, and the space in the inside of the glass forms a spherical pore. On the glass outermost surface 200, the depression caused by the space between the glass particles G is smoothed. This state is shown in FIG. 4. Not only the pore due to the space between the glass particles G, but also pores are formed by generation of a gas at the time when the glass is softened, in some cases. For example, when an organic material is adhered to the surface of the glass layer, it decomposes to generate $CO_2$, thereby forming pores in some cases. Further, such a thermally decomposable material may be introduced to positively generate pores. Such a state is usually obtained in the vicinity of the softening temperature. The viscosity of the glass is as high as $10^{7.6}$ poises at the softening temperature, so that the pores cannot rise to the surface in the case where the size of the pores is several microns or less. Accordingly, it is possible to further smooth the surface while inhibiting the pores from rising to the surface by adjusting the material composition so as to generate small pores and by further increasing the temperature or by prolonging the retention time. When cooled from the state in which the surface is smoothed in this way, as shown in FIG. 5, the scattering glass layer is obtained in which the density of the scattering material has in-plane uniformity and is smaller in the inside of the glass layer than in the surface thereof and which has a smooth surface.

Like this, it is possible to inhibit the generation of the pores and depressions in the outermost surface of the glass layer while leaving the pores in the glass layer by adjusting the material composition and firing temperature for forming the glass layers. Namely, it becomes possible to provide the electrode-attached translucent substrate excellent in scattering characteristics and high in surface smoothness by adjusting the firing temperature profile and adjusting the firing temperature so as to prevent the scattering material form rising and to leave the pore in the glass layer not to rise to the surface.

Figure 6:
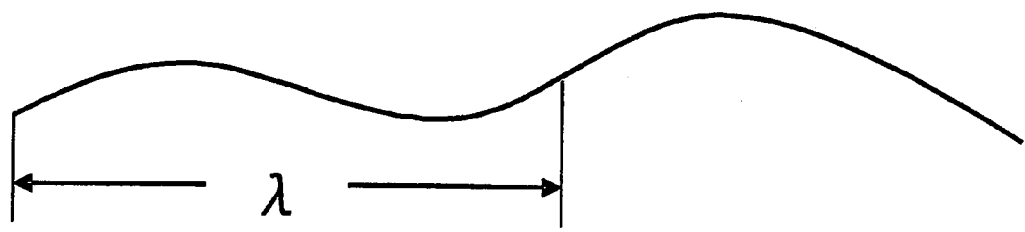
FIG. 6 is a schematic view showing a state of waviness of a surface of the scattering layer of embodiment 1 of the invention.

Further, at this time, the surface of the glass layer undulates in some cases depending on the treating temperature, the glass material for the glass layer, the size of the glass particles and the substrate material. A schematic view thereof is shown in FIG. 6. The waviness as used herein has a period $\lambda$ of 10 µm or more. The size of the waviness is from about 0.01 µm to about 5 µm in terms of waviness roughness Ra. Even when such waviness is present, the microscopic smoothness, namely microscopic surface roughness Ra, is kept 30 nm or less.

The waviness roughness Ra and average wavelength R$\lambda$a as used herein mean values calculated based on JIS B0601 (2001) Standard (translated standard of ISO97) with a cut-off value of short wavelength of 25.0 µm, and a cut-off value of long wavelength of 2.5 mm.

Further, the surface roughness Ra means surface roughness microscopically observed, and means a value calculated based on the JIS B0601 (1994) as a cut-off value of long wavelength being 10 µm.

Figure 7:
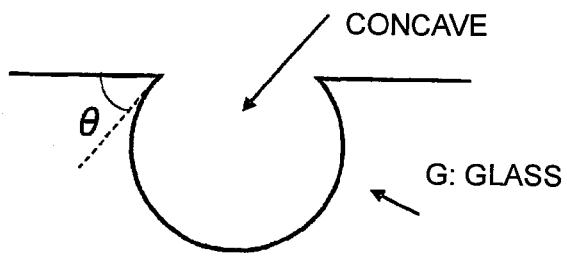
FIG. 7 is a schematic view showing a state of a microscopic concave portion of the surface of the scattering layer.
Figure 8:
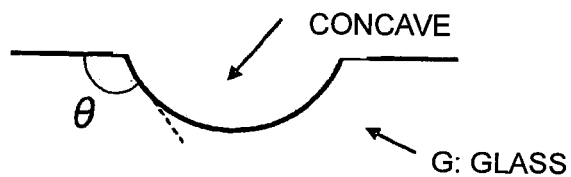
FIG. 8 is a schematic view showing a state of a microscopic concave portion of the surface of the scattering layer.

When the treating temperature is low, a microscopic concave portion of the outermost surface is left in some cases. However, the shape of the concave portion becomes gentle as shown in FIG. 8, not an overhung shape as shown in FIG. 7. The overhung shape as used herein means that the angle θ is an acute angle as shown in FIG. 7, and the term "gentle" means that θ in FIG. 8 is an obtuse angle or a right angle. When the shape is gentle as described above, it is said that this concave portion causes an interelectrode short circuit of the organic LED element is low. The firing temperature is desirably about 40° C. to about 60° C. higher than the glass transition temperature. A too low temperature causes insufficient sintering, resulting in failure to smooth the surface. Accordingly, the firing temperature is more desirably about 50° C. to about 60° C. higher than the glass transition temperature.

Figure 9:
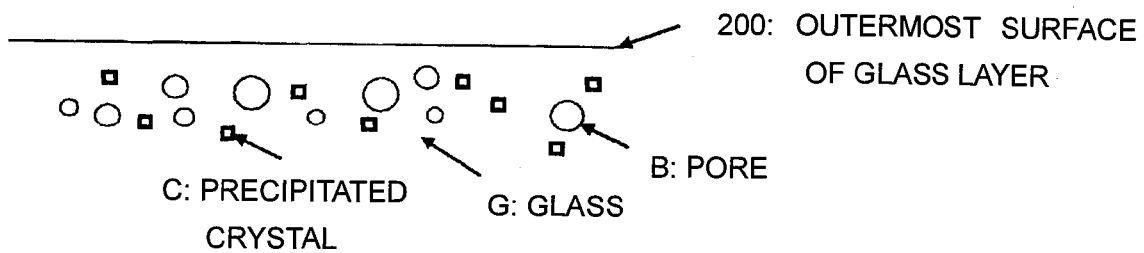
FIG. 9 is a schematic view showing a state of the surface of the scattering layer of embodiment 1 of the invention.

Further, use of the easily crystallizable glass makes it possible to precipitate crystals in the inside of the glass layer. At this time, when the crystals have a size of 0.1 µm or more, they act as a light scattering material. A state at this time is shown in FIG. 9. A suitable selection of the firing temperature makes it possible to precipitate the crystals in the inside of the glass layer while inhibiting the precipitation of the crystals in the outermost surface of the glass layer as described above. Specifically, it is desirable that the temperature is about 60° C. to about 100° C. higher than the glass transition temperature. On such an increase in temperature as this, the viscosity of the glass is high, and pores do not rise to the surface.

Figure 10:
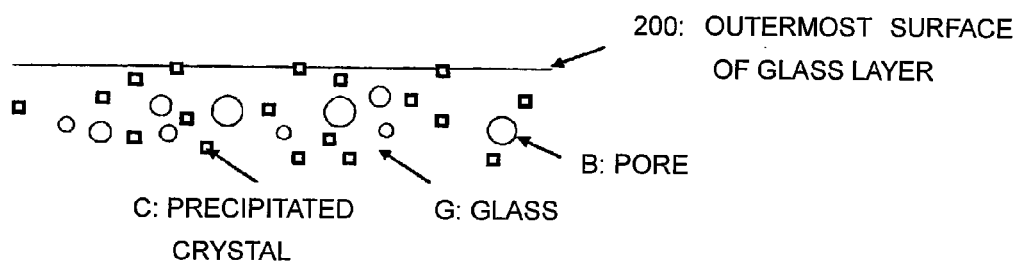
FIG. 10 is a schematic view showing a state of a scattering layer of a comparative example (when the firing temperature is too high).

When the temperature is too high, the crystals also precipitate in the outermost surface of the glass layer to be liable to lose smoothness of the outermost surface. This is therefore unfavorable. A schematic view thereof is shown in FIG. 10. Accordingly, the firing temperature is more preferably about 60° C. to about 80° C. higher than the glass transition temperature, and most preferably about 60° C. to about 70° C. higher than the glass transition temperature. Such a technique makes it possible to allow the pores and the precipitated crystals to exist in the glass layer as the scattering material and to inhibit the generation thereof in the glass outermost surface. The reason why these are possible is that the glass is flattened for itself within the certain temperature range, and that high viscosity at which the pores do not rise to the surface can be realized or the crystals can be precipitated. In the case of a resin, it is difficult to control the process at high viscosity as described above, and also the crystals cannot be precipitated.

As described above, the translucent substrate in which the density of the scattering material in the outermost surface of the scattering layer is lower than the density of the scattering material in the inside of the scattering layer can be obtained by adjusting the material composition and the firing conditions.

Further, it becomes possible to obtain the translucent substrate having sufficient scattering characteristics and a smooth surface by using a translucent substrate in which there is present such δ that the density $\rho_1$ of the scattering material at a half thickness of the scattering layer comprising a glass and the density $\rho_2$ of the scattering material at a distance x from the outermost surface of the scattering layer, which satisfies $\delta/2 \leq x \leq \delta$, satisfy $\rho_1 \geq \rho_2$.

Further, in the scattering layer, the surface forms waviness constituting a curved surface, thereby being able to inhibit the appearance from being spoiled by reflection, when the organic EL element formed on the scattering layer has a reflective electrode. When the reflective electrode is used, it has been a problem that the appearance is spoiled by reflection due to the reflective electrode at the time of non-light emission. However, according to the invention, the accuracy of a pattern formed on the scattering layer is not deteriorated, variation does not occurs in interelectrode distance, and the contact area of the electrode and the layer having a light-emitting function can be increased, by making the conditions suitable when the scattering layer is formed. Accordingly, the effective element area can be increased, thereby being able to form the long-life, high-intensity organic EL element.

Furthermore, as the waviness is schematically shown in FIG. 6, the ratio Ra/Rλa of the waviness roughness Ra on the surface of the scattering layer to the wavelength Rλa of the waviness is desirably from $1.0 \times 10^{-3}$ to $3.0 \times 10^{-2}$.

In addition, the surface roughness Ra of the surface of the scattering layer is desirably 30 nm or less. More desirably, the surface roughness of the scattering layer is 10 nm or less.

For example, when the organic EL element is formed on such a translucent substrate, for example, the translucent substrate is required to be thinly formed. It is at a surface roughness of 30 nm or less, desirably 10 nm or less that this translucent electrode can be formed without being affected by a ground. When the surface roughness exceeds 30 nm, coatability of the organic layer formed thereon deteriorates in some cases, and a short circuit occurs between the translucent electrode formed on the glass scattering later and the other electrode in some cases. The interelectrode short circuit causes non-lighting of the element, but it is possible to restore it by applying an overcurrent in some cases. In order to make the restoration possible, the roughness of the glass scattering layer is desirably 10 nm or less, and more desirably 3 nm or less.

Incidentally, in a certain material system, it is known that a surface roughness Ra of 10 nm or less can be obtained when the firing temperature is adjusted to 570° C. or more. Although the optimum firing conditions vary depending on the material system, the scattering material is inhibited from being present in the outermost surface by controlling the kind or size of scattering material, thereby being able to obtain the scattering layer with an excellent surface smoothness.

Further, when the pores are present in the scattering layer, an increase in size of the pores increases buoyancy in a scattering layer forming process such as firing, resulting in an easy rising of the pores to the surface. When the pores reach the outermost surface, there is the possibility that they burst to significantly deteriorate the surface smoothness. Furthermore, the number of the scattering materials relatively decreases in that portion, so that scatterability decreases only in that portion. Coagulation of such large pores also results in visual observation as unevenness. Moreover, the ratio of the pores having a size of 5 μm or more is desirably 15 vol % or less, more desirably 10 vol % or less, and still more desirably 7 vol % or less. In addition, even when the scattering material is other than the pores, the number of the scattering material relatively decreases in that portion, so that scatterability decreases only in that portion. Accordingly, the ratio of the scattering material having a maximum length of 5 μm or more is desirably 15 vol % or less, more desirably 10 vol % or less, and still more desirably 7 vol % or less.

Still further, when the reflective electrode is used, there has been a problem that the appearance is spoiled by the occurrence of reflection due to the reflective electrode at the time of non-light emission. However, when the scattering layer is formed, the conditions are optimized, thereby being able to form waviness shape on the surface of the scattering layer.

The waviness of the surface of the scattering layer was measured. SURFCOM 1400D manufactured by Tokyo Seimitsu Co., Ltd. was used for the measurement. The cutoff wavelength used herein was 2.5 mm. Then, aluminum was vacuum vapor deposited on this scattering layer-attached glass substrate to a thickness of 80 nm, the diffuse reflectivity of a film formation surface of the aluminum layer was measured, and the ratio b of scattering light was calculated. LANBDA 950 manufactured by Perkin Elmer Inc. was used for the measurement.

The results thereof are shown in Table 1.

TABLE 1

| | Glass Material | Ra (μm) | Rλa (μm) | Ra/Rλa ($10^{-2}$) | Surface Area Ratio | Diffuse Reflection Ratio |
|---|---|---|---|---|---|---|
| A | Fired at 550° C. | 3.39 | 143 | 2.37 | 1.0352 | 98% |
| | Fired at 560° C. | 2.58 | 216 | 1.19 | 1.0111 | 85% |
| | Fired at 570° C. | 2.53 | 236 | 1.07 | 1.0088 | 95% |
| | Fired at 580° C. | 1.68 | 302 | 0.556 | 1.0027 | 60% |
| B | | 4.74 | 492 | 0.963 | 1.0082 | 72% |
| C | | 0.04 | 171 | 0.0234 | 1.0001 | 38% |

Here, A is glass materials comprising 23.1 mol % of $P_2O_5$, 12.0 mol % of $B_2O_3$, 11.6 mol % of $Li_2O$, 16.6 mol % of $Bi_2O_3$, 8.7 mol % of $TiO_2$, 17.6 mol % of $Nb_2O_5$ and 10.4 mol % of $WO_3$ and fired at the respective temperatures, B is a glass material having the same composition as A with exception that $Bi_2O_3$ is decreased to 5.5 mol % and that $Na_2O$ and $K_2O$ are added in amounts of 4 mol % and 2.5 mol %, respectively, and fired at 530° C., and C is a glass material having the composition shown in Table 12 and obtained by firing a scattering layer constituted. The glass transition temperature Tg of A is 499° C., and that of B is 481° C.

By adjusting the firing conditions like this, the waviness can be given to the surface, and this makes it possible to reduce specular reflectivity. Accordingly, even when scatterability of the scattering layer is low, reflection due to the fact that the reflective electrode has specularity can be decreased.

Here, it is described that the ratio (Ra/Rλa) between the waviness roughness Ra and the wavelength Rλa of the waviness of the surface is desirably from $1.0 \times 10^{-3}$ to $3.0 \times 10^{-2}$. This fact can be confirmed from Table 1. In Table 1, C has smaller Ra to such an extent that the ratio (Ra/Rλa) is less than $1.0 \times 10^{-3}$, so that sufficient diffuse reflection ratio cannot be obtained. Further, when Rλa is large to such an extent that the ratio (Ra/Rλa) is less than $1.0 \times 10^{-3}$, or the waviness roughness Ra is small, sufficient diffuse reflection ratio cannot be obtained. Furthermore, when the waviness rough is large to such an extent that the ratio (Ra/Rλa) exceeds $3.0 \times 10^{-2}$, it is difficult to form a device.

Further, the content of the scattering materials in the scattering layer is desirably at least 1 vol %.

The experiment results reveal that when the scattering material is contained in an amount of 1 vol % or more, sufficient light scatterability can be obtained. Further desirably, when the scattering material is contained in an amount of 5 vol % or more, better light scatterability can be obtained.

Furthermore, there are the case where the scattering material is pores, the case where it is material particles having a composition different from that of the base layer and the case where it is precipitated crystals of the base layer. These may be used either alone or as mixture thereof.

When the scattering material is pores, the size of the pores, pore distribution or density can be adjusted by adjusting the firing conditions such as the firing temperature.

When the scattering material is material particles having a composition different from that of the base material, the size, distribution or density of the scattering material can be adjusted by adjusting the material composition or the firing conditions such as the firing temperature.

When the scattering material is precipitated crystals of the glass constituting the base layer, the size of the pores, pore distribution or density can be adjusted by adjusting the firing conditions such as the firing temperature.

The scattering layer of the invention obtains the glass layer containing the scattering material by coating and firing, so that the in-plane distribution of the scattering materials is basically nearly uniform.

Further, the first refractive index of the base layer for at least one wavelength of wavelengths λ (430 nm<λ<650 nm) is desirably 1.8 or more, but it is difficult to form a high refractive index material layer. Therefore, in the invention, even when a material in which the first refractive index of the base layer is smaller than the third refractive index which is a refractive index of the translucent electrode is used, the refractive index is adjusted by adjusting the scattering material in the glass material, thereby making it possible to increase the extraction efficiency.

Here, the in-plane uniformity has been described. The in-plane distribution of the scattering material is desirably uniform, but may not always be uniform.

Further, the distribution in a depth direction of the scattering material is not limited to the above-mentioned embodiments, and can be appropriately modified.

The respective members will be described in detail below.

Substrate

A material having a high refractive index for visible light, mainly a glass substrate, is used as a substrate 101 used for the formation of the translucent substrate. As the material having a high refractive index, specifically, a plastic substrate as well as the glass substrate may be used. As a material for the glass substrate, an inorganic glass such as alkali glass, non-alkali glass or quartz glass may be mentioned. Further, as a material for the plastic substrate, a polyester, a polycarbonate, a polyether, a polysulfone, a polyethersulfone, a polyvinyl alcohol or a fluorine-containing polymer such as polyvinylidene fluoride or polyvinyl fluoride may be mentioned. Incidentally, in order to prevent moisture from passing though the substrate, the plastic substrate may be constituted so that barrier properties are given thereto. The thickness of the translucent substrate 101 is preferably from 0.1 mm to 2.0 mm in the case of glass. However, too thin substrate results in a decrease in strength, so that it is particularly preferred that the thickness is from 0.5 mm to 1.0 mm.

Incidentally, in order to prepare the scattering layer by glass frit, the thermal expansion coefficient is preferably $50 \times 10^{-7}/°$ C. or more, more preferably $70 \times 10^{-7}/°$ C. or more and still more preferably $80 \times 10^{-7}/°$ C. or more, because of a problem of strain and the like are encountered.

Further, it is desirable that the average thermal expansion coefficient of the scattering layer at 100° C. to 400° C. is from $70 \times 10^{-7}$ (° C.$^{-1}$) to $95 \times 10^{-7}$ (° C.$^{-1}$), and that the glass transition temperature is from 450° C. to 550° C.

Scattering Layer

A constitution, a preparation method and characteristics of the scattering layer and a measuring method of the refractive index will be described in detail below. Incidentally, in order to realize an improvement of the light-extraction efficiency which is the principal object of the invention, the refractive index of the scattering layer must be equivalent to or higher than the refractive index of a translucent electrode material, although details thereof are described later. In the invention, the scattering layer having a refractive index equivalent to or higher than the third refractive index which is a refractive index of the translucent electrode material is realized by adjusting the scattering material, while the first refractive index of the base layer constituting the scattering layer is small.

Calculating Method

In order to obtain characteristics of the scattering layer described later, the present inventors performed optical simulations, and examined, for respective parameters, influences exerted on the extraction efficiency thereby. A computing software used is a software SPEOS manufactured by OPTIS Corporation. This software is a ray trace software, and at the same time, it is possible to apply a theoretical formula of Mie scattering to the scattering layer. The thickness of the organic layer actually used as a layer having a light-emitting function, such as a charge-injection-transport layer or a light-emitting layer, is actually from about 0.1 μm to about 0.3 μm in total. However, in the ray trace, the angle of a ray does not change even when the thickness is changed. Accordingly, it was taken as 1 μm of the minimum thickness allowed in the software. For a similar reason, the total thickness of the glass substrate and the scattering layer was taken as 100 μm. Further, for simplicity, calculation was made dividing the organic layer and the translucent electrode into three of the charge-injection layer and the light-emitting layer, a hole-injection-transport layer, and the translucent electrode. In the calculation, the refractive indexes of these are assumed as the same. However, the refractive indexes of the organic layer and the translucent electrode are equivalent value, so that the calculated results are not largely changed. Strictly considered, a waveguide mode caused by interference stands, because the organic layer is thin. However, the results are not largely changed, even when geometric-optically treated. This is therefore sufficient for estimating the advantages of this invention. In the organic layer, emitted light is assumed to be outgone from a total of 6 faces without having directivity. The calculation was made, taking the total light flux amount as 1,000 lm and the number of light rays as 100,000 rays or 1,000,000 rays. The light outgone from the translucent substrate was captured by a receiving surface mounted 10 μm above the translucent substrate, and the extraction efficiency was calculated from the illuminance thereof.

Constitution

In this embodiment, as described above, the scattering layer 102 is formed by forming a glass powder on the glass substrate by a method such as coating and firing it at a desired temperature, and has the base material 102 having a first refractive index and a plurality of scattering materials 104 dispersed in the base material 102 and having a second refractive index different from that of the base material. The intralayer distribution of the scattering materials in the scattering layer decreases from the inside of the scattering layer to the outermost surface. Use of the glass layer makes it possible to keep smoothness of the surface while having excellent scattering characteristics, as described above, and use thereof on the light outgoing surface side of the light-emitting device or the like makes it possible to realize extremely high-efficient light extraction.

Further, as the scattering layer, a material (base material) having a main surface coated and having a high light transmittance may be used. As the base material, a glass, a crystallized glass, a translucent resin or a translucent ceramic may be used. As a material for the glass, an inorganic glass such as soda lime glass, borosilicate glass, non-alkali glass or quartz glass may be used. Incidentally, a plurality of scattering materials 104 (for example, pores, precipitated crystals, material particles different from the base material or phase-separated glass) are formed in the inside of the base material. The particle as used herein means a small solid material, and there is a filler or a ceramic. Further, the pore means an air or gas material. Furthermore, the phase-separated glass means a glass composed of two or more kinds of glass phases. Incidentally, when the scattering material is the pore, the size of the scattering material indicates a size of a void.

Further, in order to realize an improvement of the light-extraction efficiency which is normally the principal object of the invention, the refractive index of the scattering layer must be equivalent to or higher than the refractive index of the translucent electrode material. When the refractive index is low, a loss due to total reflection occurs at an interface between the base material and the translucent electrode material. For this reason, in the invention, even when the refractive index of the base material is small, the extraction efficiency is compensated by the distribution of the scattering material, thereby increasing the refractive index as the whole scattering layer to a refractive index equivalent to or higher than the refractive index of the translucent electrode, so that the extraction efficiency is improved. Here, the refractive index of the scattering layer is only required to exceed for at least one portion (for example, red, blue, green or the like) in the emission spectrum range of the light-emitting layer. However, it exceeds preferably over the whole region (430 nm to 650 nm) of the emission spectrum range, and more preferably over the whole region (360 nm to 830 nm) of the wavelength range of visible light.

Further, in order to prevent the interelectrode short circuit of the organic LED element, the main surface of the scattering layer is required to be smooth. For that purpose, it is unfavorable that the scattering materials protrude from the main surface of the scattering layer. Also in order to prevent the scattering materials from protruding from the main surface of the scattering layer, it is preferred that the scattering materials are not present within 0.2 μm from the main surface of the scattering layer. The arithmetic average roughness (surface roughness: Ra) of the main surface of the scattering layer specified in JIS B0601-1994 is preferably 30 nm or less, more preferably 10 nm or less (see Table 1), and particularly desirably 1 nm or less. Although both the refractive indexes of the scattering material and the base material may be high, the difference ($\Delta n$) in the refractive indexes is preferably 0.2 or more for at least one portion in the emission spectrum range of the scattering layer. In order to obtain sufficient scattering characteristics, the difference ($\Delta n$) in the refractive indexes is more preferably 0.2 or more over the whole region (430 nm to 650 nm) of the emission range or the whole region (360 nm to 830 nm) of the wavelength range of visible light.

In order to obtain the maximum refractive index difference, a constitution of using a high refractive index glass as the high light transmittance material and the glass material, namely pores, as the scattering material is desirable. In the invention, the refractive index of the base material may be smaller than the refractive index of the translucent electrode, so that the degree of freedom in the selection of usable materials is increased. However, even in this case, the refractive index of the base material is desirably as high as possible, so that the high refractive index glass is preferably used as the base material. For components of the high refractive index glass, there can be used the high refractive index glass containing one or two or more kinds of components selected from $P_2O_5$, $SiO_2$, $B_2O_3$, $Ge_2O$ and $TeO_2$ as network formers, and one or two or more kinds of components selected from $TiO_2$, $Nb_2O_5$, $WO_3$, $Bi_2O_3$, $La_2O_3$, $Gd_2O_3$, $Y_2O_3$, $ZrO_2$, $ZnO$, $BaO$, $PbO$ and $Sb_2O_3$ as high refractive index components. In addition, in a sense of adjusting characteristics of the glass, an alkali oxide, an alkaline earth oxide, a fluoride or the like may be used within the range not impairing characteristics required for the refractive index. Specific glass systems include a $B_2O_3$—$ZnO$—$La_2O_3$ system, a $P_2O_5$—$B_2O_3$—$R'_2O$—$R''O$—$TiO_2$—$Nb_2O_5$—$WO_3$—$Bi_2O_3$ system, a $TeO_2$—$ZnO$ system, a $B_2O_3$—$Bi_2O_3$ system, a $SiO_2$—$Bi_2O_3$ system, a $SiO_2$—$ZnO$ system, a $B_2O_3$—$ZnO$ system, a $P_2O_5$—$ZnO$ system and the like, wherein R' represents an alkali metal element, and R'' represents an alkaline earth metal element. Incidentally, the above are examples, and the glass system is not construed as being limited to these examples as long as it is constituted so as to satisfy the above-mentioned conditions.

It is also possible to change color of light emission by allowing the base material to have a specific transmittance spectrum. As colorants, known ones such as a transition metal oxide, a rare earth metal oxide and a metal colloid can be used alone or in combination thereof.

Here, in general, while light emission is necessary for backlight and lighting applications. For whitening, there are known a method in which red, blue and green are spatially selectively coated (selective coating method), a method of laminating light-emitting layers having different light emission colors (lamination method) and a method of color changing light emitted in blue with a color changing material spatially separately provided (color changing method). In the backlight and lighting applications, what is necessary is just to uniformly obtain white color, so that the lamination method is generally used. The light-emitting layers to be laminated are used in such a combination that white color is obtained by additive color mixing. For example, a blue-green layer and an orange layer are laminated, or red, blue and green are laminated, in some cases. In particular, in the lighting application, color reproducibility at a reflective surface is important, so that it is desirable to have an emission spectrum necessary for a visible light region. When the blue-green layer and the orange layer are laminated, lighting of one with a high proportion of green deteriorates color reproducibility, because of low light emission intensity of green color. The lamination method has a merit that it is unnecessary to spatially change a color arrangement, whereas it has the following two problems. The first problem is that the emitted light extracted is influenced by interference, because the film thickness of the organic layer is thin as described above. Accordingly, color changes depending on the viewing angle. In the case of white color, such a phenomenon becomes a problem in some cases, because the sensitivity of the human eye to color is high. The second problem is that a carrier balance is disrupted during light emission to cause changes in light-emitting luminance in each color, resulting in changes in color.

A conventional organic LED element has no idea of dispersing a fluorescent material in a scattering layer or a diffusing layer, so that it cannot solve the above problem of changes in color. Accordingly, the conventional organic LED element has been insufficient yet for the backlight and lighting applications. However, in the substrate for an organic LED element and the organic LED element of the invention, the fluorescent material can be used in the scattering material or the base material. This can cause an effect of performing wavelength conversion by light emission from the organic layer to change color. In this case, it is possible to decrease the light emission colors of the organic LED, and the emitted light is extracted after being scattered. Accordingly, the angular dependency of color and changes in color with time can be inhibited.

Preparation Method of Scattering Layer

The preparation of the scattering layer is carried out by coating and firing. In particular, from the viewpoint of forming rapidly and uniformly a film thickness of 10 to 100 μm with a large area, a method of preparing the layer by using a frit-pasted glass is preferred. In order to utilize a frit paste method, it is desirable that the softening point (Ts) of the glass of the scattering layer is lower than the strain point (SP) of the substrate glass, and that the difference in the thermal expansion coefficient (α) is small, for inhibiting thermal deformation of the substrate glass. The difference between the softening point and the strain point is preferably 30° C. or more, and more preferably 50° C. or more. Further, the difference in the expansion coefficient between the scattering layer the substrate glass is preferably $\pm 10 \times 10^{-7}$ (1/K) or less, and more preferably $\pm 5 \times 10^{-7}$ (1/K) or less. The frit paste as used herein indicates one in which a glass powder is dispersed in a resin, a solvent, a filler or the like. Glass layer coating becomes possible by patterning the frit paste using a pattern forming technique such as screen printing and firing it. The technical outline will be described below.

Frit Paste Material
1. Glass Powder

The particle size of the glass powder is from 1 μm to 10 μm. In order to control the thermal expansion of the film fired, a filler is incorporated in some cases. As the filler specifically, zircon, silica, alumina or the may be used, and the particle size thereof is from 0.1 μm to 20 μm.

Glass materials will be described below.

In the invention, the scattering layer uses a glass containing 20 to 30 mol % of $P_2O_5$, 3 to 14 mol % of $B_2O_3$, 10 to 20 mol % of $Li_2O$, $Na_2O$ and $K_2O$ in terms of total amount thereof, 10 to 20 mol % of $Bi_2O_3$, 3 to 15 mol % of $TiO_2$, 10 to 20 mol % of $Nb_2O_5$ and 5 to 15 mol % of $WO_3$, wherein the total amount of the above components is 90 mol % or more.

The glass composition for forming the scattering layer is not particularly limited, as long as desired scattering characteristics are obtained and it can be frit-pasted and fired. However, in order to maximize the extraction efficiency, examples thereof include a system containing $P_2O_5$ as an essential component and further one or more components of $Nb_2O_5$, $Bi_2O_3$, $TiO_2$ and $WO_3$; a system containing $B_2O_3$, ZnO and $La_2O_3$ as essential components and one or more components of $Nb_2O_5$, $ZrO_2$, $Ta_2O_5$ and $WO_3$; a system containing $SiO_2$ as an essential component and one or more components of $Na_2O_5$ and $TiO_2$; and a system containing $Bi_2O_3$ as a main component and $SiO_2$, $B_2O_3$ and the like as network forming components, and the like.

Incidentally, in all glass systems used as the scattering layer in the invention, $As_2O_3$, PbO, CdO, $ThO_2$ and HgO which are components having adverse effects on the environment are not contained, except for the case of inevitable contamination therewith as impurities derived from raw materials.

The scattering layer containing $P_2O_5$ and one or more components of $Nb_2O_5$, $Bi_2O_3$, $TiO_2$ and $WO_3$ is preferably a glass within the composition range of 15 to 30% of $P_2O_5$, 0 to 15% of $SiO_2$, 0 to 18% of $B_2O_3$, 5 to 40% of $Nb_2O_5$, 0 to 15% of $TiO_2$, 0 to 50% of $WO_3$, 0 to 30% of $Bi_2O_3$, provided that $Nb_2O_5+TiO_2+WO_3+Bi_2O_3$ is from 20 to 60%, 0 to 20% of $Li_2O$, 0 to 20% of $Na_2O$, 0 to 20% of $K_2O$, provided that $Li_2O+Na_2O+K_2O$ is from 5 to 40%, 0 to 10% of MgO, 0 to 10% CaO, 0 to 10% of SrO, 0 to 20% of BaO, 0 to 20% of ZnO and 0 to 10% of $Ta_2O_5$, in terms of mol %.

Effects of the respective components are as follows in terms of mol %.

$P_2O_5$ is an essential component forming a skeleton of this glass system and performing vitrification. However, when the content is too small, devitrification of the glass increases to result in failure to obtain the glass. Accordingly, the content is preferably 15% or more, and more preferably 18% or more. On the other hand, when the content is too large, the refractive index decreases to result in failure to achieve the object of the invention. Accordingly, the content is preferably 30% or less, and more preferably 28% or less.

$B_2O_3$ is an optional component as a component which is added into the glass, thereby improving resistance to devitrification and decreasing the thermal expansion coefficient. When the content is too large, the refractive index decreases. The content is preferably 18% or less, and more preferably 15% or less.

$SiO_2$ is an optional component as a component which is added in slight amounts, thereby stabilizing the glass and improving resistance to devitrification. When the content is too large, the refractive index decreases. It is therefore preferably 15% or less, more preferably 10% or less, and particularly preferably 8% or less.

$Nb_2O_5$ is an essential component improving the refractive index and also having an effect of enhancing weather resistance at the same time. Accordingly, the content is preferably 5% or more, and more preferably 8% or more. On the other hand, when the content is too large, devitrification increases to result in failure to obtain the glass. Accordingly, the content thereof is preferably 40% or less, and more preferably 35% or less.

$TiO_2$ is an optional component improving the refractive index. However, when the content is too large, coloring of the glass increases to cause an increased loss in the scattering layer, resulting in failure to achieve the object of the improving the light-extraction efficiency. Accordingly, the content is preferably 15% or less, and more preferably 13% or less.

$WO_3$ is an optional component improving the refractive index and decreasing the glass transition temperature to decrease the firing temperature. However, excessive introduction thereof results in coloring of the glass to cause a decrease in the light-extraction efficiency. Accordingly, the content thereof is preferably 50% or less, and more preferably 45% or less.

$Bi_2O_3$ is a component improving the refractive index, and can be introduced into the glass in relatively large amounts while keeping stability of the glass. However, excessive introduction thereof poses a problem that the glass is colored to decrease the transmittance. Accordingly, the content is preferably 30% or less, and more preferably 25% or less.

In order to increase the refractive index more than the desired value, one or more components of $Nb_2O_5$, $TiO_2$, $WO_3$ and $Bi_2O_3$ described above must be necessarily contained. Specifically, the total amount of ($Nb_2O_5+TiO_2+WO_3+Bi_2O_3$) is preferably 20% or more, and more preferably 25% or more. On the other hand, when the total amount of these components is too large, coloring occurs, or devitrification excessively increases. It is therefore preferably 60% or less, and more preferably 55% or less.

$Ta_2O_5$ is an optional component improving the refractive index. However, when the amount added is too large, resistance to devitrification decreases. In addition to this, it is expensive. Accordingly, the content thereof is preferably 10% or less, and more preferably 5% or less.

The alkali metal oxides ($R_2O$) such as $Li_2O$, $Na_2O$ and $K_2O$ have an effect of improving meltability to decrease the glass transition temperature and concurrently an effect of enhancing affinity with the glass substrate to increase adhesion. For this reason, it is desirable to contain one or two or more kinds of these. These are contained preferably in an amount of 5% or more, and more preferably in an amount of 10% or more, as the total amount of ($Li_2O+Na_2O+K_2O$). However, when they are excessively contained, stability of the glass is impaired. In addition to this, all are components decreasing the refractive index, so that the refractive index of the glass decreases, resulting in failure to obtain the desired improvement of the light-extraction efficiency. Accordingly, the total content is preferably 40% or less, and more preferably 35% or less.

$Li_2O$ is a component for decreasing the glass transition temperature and improving solubility. However, the content is too much, devitrification excessively increases to result in failure to obtain homogeneous glass. Further, the thermal expansion coefficient excessively increases to increase the difference in the expansion coefficient from the substrate. At the same time, the refractive index also decreases to result in failure to achieve a desired improvement of the light-extraction efficiency. Accordingly, the content is desirably 20% or less, and more preferably 15% or less.

Both of $Na_2O$ and $K_2O$ are optional components improving meltability. However, excessive inclusion thereof causes a decrease in the refractive index, resulting in failure to achieve the desired light-extract efficiency. Accordingly, the contents are each preferably 20% or less, and more preferably 15% or less.

ZnO is a component improving the refractive index and decreasing the glass transition temperature. However, when it is excessively added, devitrification of the glass increases to result in failure to obtain the homogeneous glass. Accordingly, the content is preferably 20% or less, and more preferably 18% or less.

BaO is a component improving the refractive index and concurrently improving solubility. However, when it is excessively added, stability of the glass is impaired. Accordingly, the content thereof is preferably 20% or less, and more preferably 18% or less.

MgO, CaO and SrO are optional components improving solubility, and components decreasing the refractive index at the same time. Accordingly, the contents are each preferably 10% or less, and more preferably 8% or less.

In order to obtain the high refractive index and stable glass, the total amount of the above components is preferably 90% or more, more preferably 93% or more, and still more preferably 95% or more.

In addition to the components described above, a refining agent, a vitrification enhancing component, a refractive index adjusting component, a wavelength converting component or the like may be added in small amounts within the range not impairing necessary glass characteristics. Specifically, the refining agents include $Sb_2O_3$ and $SnO_2$, the vitrification enhancing components include $GeO_2$, $Ga_2O_3$ and $In_2O_3$, the refractive index adjusting components include $ZrO_2$, $Y_2O_3$, $Gd_2O_3$ and $Yb_2O_3$, and the wavelength converting components include rare earth components such as $CeO_2$, $Eu_2O_3$ and $Er_2O_3$, and the like.

The scattering layer containing $B_2O_3$ and $La_2O_3$ as essential components and one or more components of $Nb_2O_5$, $ZrO_2$, $Ta_2O_5$ and $WO_3$ is preferably a glass within a composition range of: 20 to 60% of $B_2O_3$, 0 to 20% of $SiO_2$, 0 to 20% of $Li_2O$, 0 to 10% of $Na_2O$, 0 to 10% of $K_2O$, 5 to 50% of ZnO, 5 to 25% of $La_2O_3$, 0 to 25% of $Gd_2O_3$, 0 to 20% of $Y_2O_3$, 0 to 20% of $Yb_2O_3$, provided that $La_2O_3+Gd_2O_3+Y_2O_3+Yb_2O_3$ is from 5 to 30%, 0 to 15% of $ZrO_2$, 0 to 20% of $Ta_2O_5$, 0 to 20% of $Nb_2O_5$, 0 to 20% of $WO_3$, 0 to 20% of $Bi_2O_3$ and 0 to 20% of BaO, in terms of mol %.

Effects of the respective components are as follows in terms of mol %.

$B_2O_3$ is a network forming oxide and is an essential component in this glass system. When the content is too small, glass formation is not performed, or resistance to devitrification of the glass decreases. Accordingly, it is contained preferably in an amount of 20% or more, and more preferably in an amount of 25% or more. On the other hand, when the content is too large, the refractive index decreases, and further, weather resistance decreases. Accordingly, the content is restricted to 60% or less, and more preferably, it is 55% or less.

$SiO_2$ is a component improving stability of the glass when added into the glass of this system. However, the amount introduced is too large, the refractive index decreases, and the glass transition temperature increases. For this reason, the content is preferably 20% or less, and more preferably 18% or less.

$Li_2O$ is a component decreasing the glass transition temperature. However, when the amount introduced is too large, resistance to devitrification of the glass decreases. For this reason, the content is preferably 20% or less, and more preferably 18% or less.

$Na_2O$ and $K_2O$ improve solubility. However, introduction thereof causes a decrease in resistance to devitrification and a decrease in the refractive index. Accordingly, each content is preferably 10% or less, and more preferably 8% or less.

ZnO is an essential component improving the refractive index of the glass and decreasing the glass transition temperature. For this reason, the amount thereof is preferably 5% or more, and more preferably 7% or more. On the other hand, when the amount added is too large, resistance to devitrification decreases to result in failure to obtain the homogeneous glass. Accordingly, the content is preferably 50% or less, and more preferably 45% or less.

$La_2O_3$ is an essential component achieving a high refractive index and improving weather resistance when introduced into the $B_2O_3$ system glass. For this reason, the amount introduced is preferably 5% or more, and more preferably 7% or more. On the other hand, when the addition amount is too large, the glass transition temperature increases, or resistance to devitrification of the glass increases, resulting in failure to obtain the homogeneous glass. Accordingly, the content is preferably 25% or less, and more preferably 22% or less.

$Gd_2O_3$ is a component achieving a high refractive index, improving resistance when introduced into the $B_2O_3$ system glass and improving stability of the glass by coexistence with $La_2O_3$. However, when the amount introduced is too large, stability of the glass decreases. Accordingly, the content thereof is preferably 25% or less, and more preferably 22% or less.

$Y_2O_3$ and $Yb_2O_3$ are components achieving a high refractive index, improving resistance when introduced into the $B_2O_3$ system glass and improving stability of the glass by coexistence with $La_2O_3$. However, when the amount introduced is too large, stability of the glass decreases. Accordingly, the contents are each preferably 20% or less, and more preferably 18% or less.

The rare earth oxides such as $La_2O_3$, $Gd_2O_3$, $Y_2O_3$ and $Yb_2O_3$ are components essential for achieving a high refractive index and improving weather resistance of the glass. Accordingly, the total amount of these components, $La_2O_3+Gd_2O_3+Y_2O_3+Yb_2O_3$, is preferably 5% or more, and more preferably 8% or more. However, when the amount introduced is too large, resistance to devitrification of the glass decreases to result in failure to obtain the homogeneous glass. Accordingly, the content is preferably 30% or less, and more preferably 25% or less.

$ZrO_2$ is a component for improving the refractive index. However, when the content is too large, resistance to devitrification decreases, or the liquid phase temperature is excessively increased. Accordingly, the content is preferably 15% or less, and more preferably 10% or less.

$Ta_2O_5$ is a component for improving the refractive index. However, when the content is too large, resistance to devitrification decreases, or the liquid phase temperature is excessively increased. Accordingly, the content is preferably 20% or less, and more preferably 15% or less.

$Nb_2O_5$ is a component for improving the refractive index. However, when the content is too large, resistance to devitrification decreases, or the liquid phase temperature is excessively increased. Accordingly, the content is preferably 20% or less, and more preferably 15% or less.

$WO_3$ is a component for improving the refractive index. However, when the content is too large, resistance to devitrification decreases, or the liquid phase temperature is excessively increased. Accordingly, the content is preferably 20% or less, and more preferably 15% or less.

$Bi_2O_3$ is a component for improving the refractive index. However, when the content is too large, resistance to devitrification decreases, or coloring occurs in the glass to cause a decrease in the refractive index, resulting in a decrease in extraction efficiency. Accordingly, the content is preferably 20% or less, and more preferably 15% or less.

BaO is a component for improving the refractive index. However, when the content is too large, resistance to devitrification decreases. Accordingly, the content is preferably 20% or less, and more preferably 15% or less.

In order to conform to the object of the present invention, the total amount of the above components is desirably 90% or more, and more preferably 95% or more. A component other than the above components may be added for the purposes of refining or an improvement of solubility, as along as it does not deviate from the effect of the present invention. Such components include, for example, $Sb_2O_3$, $SnO_2$, MgO, CaO, SrO, $GeO_2$, $Ga_2O_3$, $In_2O_3$ and fluorine.

The scattering layer containing $SiO_2$ as an essential component and one or more components of $Nb_2O_5$, $TiO_2$ and $Bi_2O_3$ is preferably a glass within the composition range of 20 to 50% of $SiO_2$, 0 to 20% of $B_2O_3$, 1 to 20% of $Nb_2O_5$, 1 to 20% of $TiO_2$, 0 to 15% of $Bi_2O_3$, 0 to 15% of $ZrO_2$, provided that $Nb_2O_5+TiO_2+Bi_2O_3+ZrO_2$ is from 5 to 40%, 0 to 40% of $Li_2O$, 0 to 30% of $Na_2O$, 0 to 30% of $K_2O$, provided that $Li_2O+Na_2O+K_2O$ is from 1 to 40%, 0 to 20% of MgO, 0 to 20% CaO, 0 to 20% of SrO, 0 to 20% of BaO and 0 to 20% of ZnO, in terms of mol %.

$SiO_2$ is an essential component acting as a network former for forming the glass. When the content thereof is too small, glass is not formed. Accordingly, the content is preferably 20% or more, and more preferably 22% or more.

$B_2O_3$ is added in relatively small amounts with $SiO_2$, thereby assisting glass formation and decreasing devitrification. However, when the content is too large, the refractive index decreases. Accordingly, the content thereof is preferably 20% or less, and more preferably 18% or less.

$Nb_2O_5$ is an essential component for improving the refractive index, and the content thereof is preferably 1% or more, and more preferably 3% or more. However, excessive addition thereof causes a decrease in resistance to devitrification of the glass to result in failure to obtain the homogeneous glass. Accordingly, the content thereof is desirably 20% or less, and more preferably 18% or less.

$TiO_2$ is an essential component for improving the refractive index, and the content thereof is preferably 1% or more, and more preferably 3% or more. However, excessive addition thereof causes a decrease in resistance to devitrification of the glass to result in failure to obtain the homogeneous glass and causes coloring to increase loss due to absorption at the time when light propagates in the scattering layer. For this reason, the content thereof is desirably 20% or less, and more preferably 18% or less.

$Bi_2O_3$ is a component for improving the refractive index. However, excessive addition thereof causes a decrease in resistance to devitrification of the glass to result in failure to obtain the homogeneous glass and causes coloring to increase loss due to absorption at the time when light propagates in the scattering layer. For this reason, the content thereof is desirably 15% or less, and more preferably 12% or less.

$ZrO_2$ is a component for improving the refractive index without deteriorating the degree of coloring. However, when the content is too large, resistance to devitrification of the glass increases to result in failure to obtain the homogeneous glass. For this reason, the content is preferably 15% or less, and more preferably 10% or less.

In order to obtain the high refractive index glass, $Nb_2O_5+TiO_2+Bi_2O_3+ZrO_2$ is preferably 5% or more, and more preferably 8% or more. On the other hand, when this total amount is too large, resistance to devitrification of the glass decreases, or coloring occurs. Accordingly, the total amount is preferably 40% or less, and more preferably 38% or less.

$Li_2O$, $Na_2O$ and $K_2O$ are components improving solubility, decreasing the glass transition temperature and enhancing affinity with the glass substrate. For this reason, the total amount of these components, $Li_2O+Na_2O+K_2O$, is preferably 1% or more, and more preferably 3% or more. On the other hand, when the content of the alkali oxide component is too large, resistance to devitrification of the glass decreases to result in failure to obtain the homogeneous glass. Accordingly, the content thereof is preferably 40% or less, and more preferably 35% or less.

BaO is a component improving the refractive index and improving solubility at the same time. However, when BaO is excessively contained, stability of the glass is impaired to result in failure to obtain the homogeneous glass. Accordingly, the content thereof is preferably 20% or less, and more preferably 15% or less.

MgO, CaO, SrO and ZnO are components improving solubility of the glass, and moderate addition thereof can decrease resistance to devitrification of the glass. However, when those components are excessively contained, devitrification increases to result in failure to obtain the homogeneous glass. Accordingly, the contents thereof are each preferably 20% or less, and more preferably 15% or less.

In order to conform to the object of the present invention, the total amount of the above components is desirably 90% or more. A component other than the above components may be added for the purposes of refining or an improvement of solubility, as along as it does not impair the advantages of the invention. Such components include, for example, $Sb_2O_3$, $SnO_2$, $GeO_2$, $Ga_2O_3$, $In_2O_3$, $WO_3$, $Ta_2O_5$, $La_2O_3$, $Gd_2O_3$, $Y_2O_3$ and $Yb_2O_3$.

The scattering layer containing $Bi_2O_3$ as a main component and $SiO_2$, $B_2O_3$ and the like as glass forming auxiliaries is preferably a glass within the composition range of 10 to 50% of $Bi_2O_3$, 1 to 40% of $B_2O_3$, 0 to 30% of $SiO_2$, provided that $B_2O_3+SiO_2$ is from 10 to 40%, 0 to 20% of $P_2O_5$, 0 to 15% of $Li_2O$, 0 to 15% of $Na_2O$, 0 to 15% of $K_2O$, 0 to 20% of $TiO_2$, 0 to 20% of $Nb_2O_5$, 0 to 20% of $TeO_2$, 0 to 10% of MgO, 0 to 10% of CaO, 0 to 10% of SrO, 0 to 10% of BaO, 0 to 10% of $GeO_2$ and 0 to 10% of $Ga_2O_3$, in terms of mol %.

Effects of the respective components are as follows in terms of mo %.

$Bi_2O_3$ is an essential component achieving a high refractive index and stably forming the glass when introduced in large amounts. For this reason, the content thereof is preferably 10% or more, and more preferably 15% or more. On the other hand, excessive addition thereof causes coloring in the glass to absorb light which should originally transmit, resulting in a decrease in extraction efficiency. In addition to this, devitrification increases to result in failure to obtain the homogeneous glass. Accordingly, the content thereof is preferably 50% or less, and more preferably 45% or less.

$B_2O_3$ is an essential component acting as a network former in the glass containing $Bi_2O_3$ in large amounts to assist glass formation, and the content thereof is preferably 1% or more, and more preferably 3% or more. However, when the amount added is too large, the refractive index of the glass decreases. Accordingly, the content is preferably 40% or less, and more preferably 38% or less.

$SiO_2$ is a component acting to assist $Bi_2O_3$ in glass formation as a network former. However, when the content is too large, the refractive index decreases. Accordingly, the content is preferably 30% or less, and more preferably 25% or less.

$B_2O_3$ and $SiO_2$ improve glass formation by a combination thereof, so that the total amount thereof is preferably 5% or more, and more preferably 10% or more. On the other hand, the amount introduced is too large, the refractive index decreases. Accordingly, the total amount is preferably 40% or less, and more preferably 38% or less.

$P_2O_5$ is a component assisting glass formation and inhibiting deterioration of the degree of coloring. However, when the content is too large, the refractive index decreases. Accordingly, the content is preferably 20% or less, and more preferably 18% or less.

$Li_2O$, $Na_2O$ and $K_2O$ are components for improving glass solubility and further decreasing the glass transition temperature. However, when those are excessively contained, devitrification increases to result in failure to obtain the homogeneous glass. Accordingly, the contents thereof are each preferably 15% or less, and more preferably 13% or less. Further, when the total amount of the above alkali oxide components, $Li_2O+Na_2O+K_2O$, is too large, the refractive index decreases, and further, resistance to devitrification decreases. Accordingly, the total amount is preferably 30% or less, and more preferably 25% or less.

$TiO_2$ is a component improving the refractive index. However, when the content is too large, coloring occurs, or resistance to devitrification decreases, resulting in failure to obtain the homogeneous glass. Accordingly, the content is preferably 20% or less, and more preferably 18% or less.

$Nb_2O_5$ is a component improving the refractive index. However, when the amount added is too large, resistance to devitrification of the glass decreases to result in failure to obtain the homogeneous glass. For this reason, the content is preferably 20% or less, and more preferably 18% or less.

$TeO_2$ is a component improving the refractive index without deteriorating the degree of coloring. However, excessive introduction thereof results in a decrease in resistance to devitrification, which causes coloring at the time when fired after fritting. Accordingly, the content thereof is preferably 20% or less, and more preferably 15% or less.

$GeO_2$ is a component improving stability of the glass while keeping the refractive index high. However, it is extremely expensive, so that the content is preferably 10% or less, and more preferably 8% or less. It is still more preferred not contain it.

$Ga_2O_3$ is a component improving stability of the glass while keeping the refractive index high. However, it is extremely expensive, so that the content is preferably 10% or less, and more preferably 8% or less. It is still more preferred not contain it.

In order to conform to the object of the present invention, the total amount of the above components is desirably 90% or more, and more preferably 95% or more. A component other than the above components may be added for the purposes of refining, an improvement of solubility, adjustment of the refractive index, and the like as along as it does not impair the advantages of the invention. Such components include, for example, $Sb_2O_3$, $SnO_2$, $In_2O_3$, $ZrO_2$, $Ta_2O_5$, $WO_3$, $La_2O_3$, $Gd_2O_3$, $Y_2O_3$, $Yb_2O_3$ and $Al_2O_3$.

The glass composition for forming the scattering layer is not particularly limited, as long as desired scattering characteristics are obtained and it can be frit-pasted and fired. However, in order to maximize the extraction efficiency, examples thereof include a system containing $P_2O_5$ and one or more components of $Nb_2O_5$, $Bi_2O_3$, $TiO_2$ and $WO_3$; a system containing $B_2O_3$ and $La_2O_3$ as essential components and one or more components of $Nb_2O_5$, $ZrO_2$, $Ta_2O_5$ and $WO_3$; a system containing $SiO_2$ as an essential component and one or more components of $Nb_2O_5$ and $TiO_2$; and a system containing $Bi_2O_3$ as a main component and $SiO_2$, $B_2O_3$ and the like as glass forming auxiliaries, and the like. Incidentally, in all glass systems used as the scattering layer in the invention, $As_2O_3$, PbO, CdO, $ThO_2$ and HgO which are components having adverse effects on the environment should not be contained, except for the case of inevitable contamination therewith as impurities derived from raw materials.

Further, the case that the refractive index may be low can use either of $R_2O$—RO—BaO—$B_2O_3$—$SiO_2$, RO—$Al_2O_3$—$P_2O_5$, $R_2$—$B_2O_3$—$SiO_2$ and the like ($R_2O$ is any of $Li_2O$, $Na_2O$ or $K_2O$, and RO is any of MgO, CaO or SrO).

2. Resin

The resin supports the glass powder and the filler after screen printing. As a specific example, there is used ethyl cellulose, nitrocellulose, an acrylic resin, a vinyl acetate resin, a butyral resin, a melamine resin, an alkyd resin, a rosin resin or the like. Used as base resins are ethyl cellulose and nitrocellulose. Incidentally, a butyral resin, a melamine resin, an alkyd resin and a rosin resin are used as additives for improving coated film strength. The debinderizing temperature at the time of firing is from 350° C. to 400° C. for ethyl cellulose and from 200° C. to 300° C. for nitrocellulose.

3. Solvent

The solvent dissolves the resin and adjusts the viscosity necessary for printing. Further, it does not dry during printing, and rapidly dries in a drying process. One having a boiling point of 200° C. to 230° C. is desirable. For adjustment of the viscosity, the solid content ratio and the drying rate, a mixture of some solvents is used. Specific examples include ether type solvents (butyl carbitol (BC), butyl carbitol acetate (BCA), diethylene glycol di-n-butyl ether, dipropylene glycol dibutyl ether, tripropylene glycol butyl ether and butyl cellosolve acetate), alcohol type solvents (α-terpineol, pine oil and Dowanol), ester type solvents (2,2,4-trimethyl-1,3-pentanediol monoisobutyrate) and phthalic acid ester type solvents (DBP (dibutyl phthalate), DMP (dimethyl phthalate) and DOP (dioctyl phthalate)). Mainly used are α-terpineol and 2,2,4-trimethyl-1,3-pentanediol monoisobutyrate. Incidentally, DBP (dibutyl phthalate), DMP (dimethyl phthalate) and DOP (dioctyl phthalate) also function as a plasticizer.

4. Others

A surfactant may be used for viscosity adjustment and frit dispersion promotion. A silane coupling agent may be used for frit surface modification.

Preparation Method of Frit Paste Film (1) Frit Paste

A glass powder and a vehicle are prepared. The vehicle as used herein means a mixture of a resin, a solvent and a surfactant. Specifically, it is obtained by putting the resin, the surfactant and the like in the solvent heated at 50° C. to 80° C., and then, allowing the resulting mixture to stand for about 4 hours to about 12 hours, followed by filtering.

Then, the glass powder and the vehicle are mixed by a planetary mixer, and then, uniformly dispersed in a three-roll mill. Thereafter, the resulting mixture is kneaded by a kneader. Usually, the vehicle is used in an amount of 20 to 30 wt % based on 70 to 80 wt % of the glass material.

The glass powder used herein desirably has a particle size that $D_{10}$ is 0.2 μm or more and $D_{90}$ is 5 μm or less. When $D_{90}$ of the particle size exceeds 5 μm, the value of the scattering layer to the film thickness increases, resulting in a decrease in uniformity of the surface. On the other hand, when $D_{10}$ of the particle size is less than 0.2 μm, the coexistence ratio of the interface increases, causing the problems that crystals are liable to be precipitated and devitrification is liable to occur.

(2) Printing

The frit paste prepared in (1) is printed by using a screen printer. The film thickness of a frit paste film formed can be controlled by the mesh roughness of a screen plate, the thickness of an emulsion, the pressing force in printing, the squeegee pressing amount and the like. After printing, drying is performed in a firing furnace.

(3) Firing

A substrate printed and dried is fired in the firing furnace. The firing comprises debinderizing treatment for decomposing the resin in the frit paste and allowing it to disappear and firing treatment for sintering and softening the glass powder. The debinderizing temperature is from 350° C. to 400° C. for ethyl cellulose, and from 200° C. to 300° C. for nitrocellulose. Heating is carried out in the atmosphere for 30 minutes to 1 hour. Then, the temperature is raised to sinter and soften the glass. The firing temperature is from the softening temperature to the softening temperature +20° C., and the shape and size of pores remaining in the inside vary depending on the treatment temperature. However, the film uniformly coated on the entire surface is fired, so that the film is basically formed so as to have uniform pore distribution over the plane. Then, cooling is carried out to form a glass layer on the substrate. Although the thickness of the film obtained is from 5 μm to 30 μm, a thicker glass layer can be formed by lamination printing.

Incidentally, when a doctor blade printing method or a die coat printing method is used in the above printing process, it becomes possible to form a thicker film (green sheet printing). A film is formed on a PET film or the like, and dried, thereby forming a green sheet. Then, the green sheet is heat pressed on the substrate by a roller or the like, and a fired film is obtained through a firing procedure similar to that of the frit paste. The thickness of the resulting film is from 50 μm to 400 μm. However, it is possible to form a thicker glass film by using the green sheets laminated.

Figure 11:
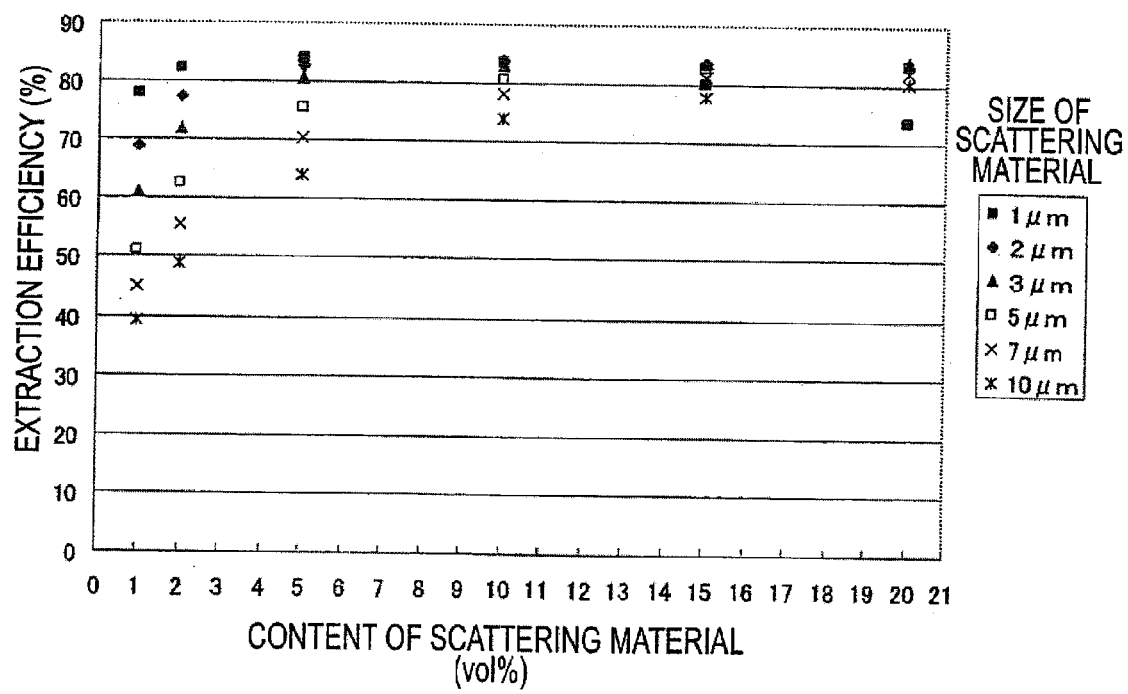
FIG. 11 is a graph showing the relationship between the light-extraction efficiency (%) and the content (vol %) of a scattering material.

Density of Scattering Material in Scattering Layer and Size of Scattering Material FIG. 11 is a graph showing the relationship between the light-extraction efficiency (%) and the content (vol %) of a scattering material. In the following, for simplicity, calculation was made dividing the organic layer and the translucent electrode into three parts, the electron-injection-transport layer and the light-emitting layer, the hole-injection-transport layer, and the translucent electrode. Here, in the graph of FIG. 11, calculation was made for the electron-injection-transport layer (thickness: 1 μm, refractive index: 1.9), the light-emitting layer (thickness: 1 μm, refractive index: 1.9), the hole-injection-transport layer (thickness: 1 μm, refractive index: 1.9), the scattering layer (thickness: 30 μm, the refractive index of the base material: 1.9, the refractive index of the scattering material: 1.0), the translucent electrode (thickness: 100 μm, refractive index: 1.54) and the light flux 1,000 lm divided into 100,000 rays (wavelength: 550 nm). As shown in the graph, the content of the scattering material in the scattering layer is preferably 1 vol % or more. Although the behavior varies depending on the size of the scattering material, when the content of the scattering material in the scattering layer is 1 vol %, the light-extraction efficiency can be 40% or more. Further, when the content of the scattering material in the scattering layer is 5 vol % or more, the light-extraction efficiency can be 65% or more. This is therefore more preferred. Furthermore, when the content of the scattering material in the scattering layer is 10 vol % or more, the light-extraction efficiency can be improved to 70% or more. This is still more preferred. In addition, when the content of the scattering material in the scattering layer is approximately 15 vol %, the light-extraction efficiency can be improved to 80% or more. This is therefore particularly preferred. Incidentally, in view of mass production of the scattering layers, the content is preferably from 10 vol % to 15 vol % at which it is difficult to be affected by production variations. Here, the scattering layer containing the scattering material is formed by printing frit glass in a paste state and firing. For this reason, in-plane distribution of the scattering material in the scattering layer is nearly uniform. Further, the scattering layer is not formed after firing but it is constituted such that the scattering layer containing the scattering material is formed by adjusting the coating period of the glass layer or the firing temperature, so that it is possible to maintain the in-plane uniformity.

Incidentally, the graph also shows the relationship between the size of the scattering material and the light-extraction efficiency. Specifically, in the case where the size of the scattering material is 1 μm, the light-extraction efficiency can be 70% or more, even when the content of the scattering material is within the range of 1 vol % to 20 vol %. In particular, when the content of the scattering material is within the range of 2 vol % to 15 vol %, the light-extraction efficiency can be 80% or more. Further, in the case where the size of the scattering material is 2 μm, the light-extraction efficiency can be 65% or more, even when the content of the scattering material is within the range of 1 vol % to 20 vol %. In particular, when the content of the scattering material is 5 vol % or more, the light-extraction efficiency can be 80% or more. Furthermore, in the case where the size of the scattering material is 3 μm, the light-extraction efficiency can be 60% or more, even when the content of the scattering material is within the range of 1 vol % to 20 vol %. In particular, when the content of the scattering material is 5 vol % or more, the light-extraction efficiency can be 80% or more. In addition, in the case where the size of the scattering material is 5 μm, the light-extraction efficiency can be 50% or more, even when the content of the scattering material is within the range of 1 vol % to 20 vol %. In particular, when the content of the scattering material is 10 vol % or more, the light-extraction efficiency can be 80% or more. Further, in the case where the size of the scattering material is 7 μm, the light-extraction efficiency can be 45% or more, even when the content of the scattering material is within the range of 1 vol % to 20 vol %. In particular, when the content of the scattering material is 10 vol % or more, the light-extraction efficiency can be 80% or more. Furthermore, in the case where the size of the scattering material is 10 μm, the light-extraction efficiency can be 40% or more, even when the content of the scattering material is within the range of 1 vol % to 20 vol %. In particular, when the content of the scattering material is 15 vol % or more, the light-extraction efficiency can be 80% or more. The above shows that when the size of the scattering material is large, the efficiency is improved with an increase in the content. On the other hand, it is seen that when the size of the scattering material is small, the light-extraction efficiency is improved, even in the case where the content is small.

Refractive Index of Scattering Material

Figure 12:
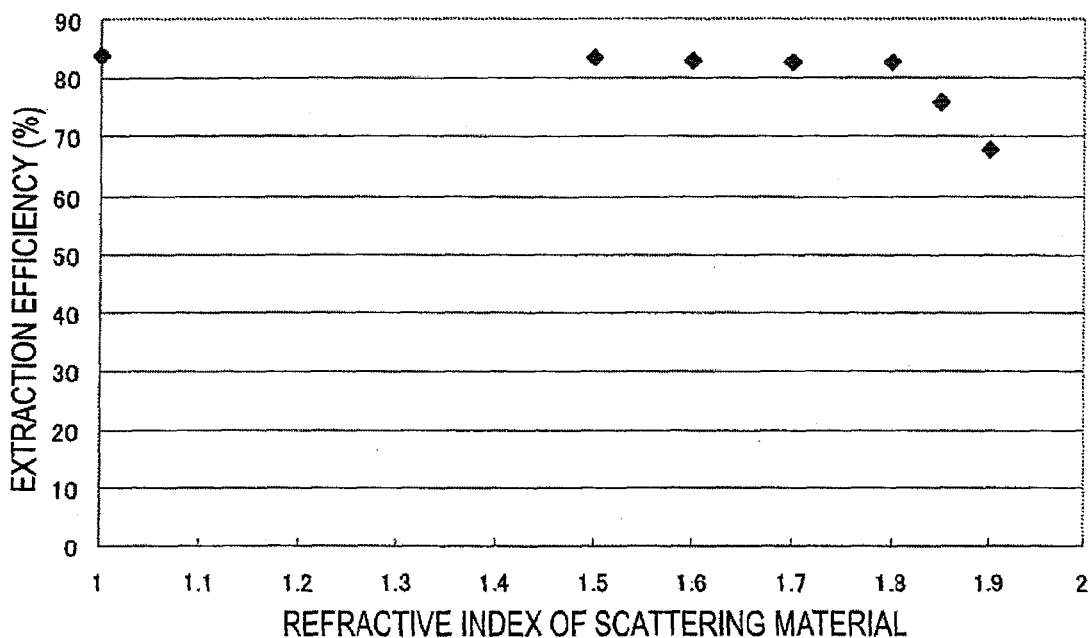
FIG. 12 is a graph showing the relationship between the light-extraction efficiency (%) and the refractive index of a scattering material.

FIG. 12 is a graph showing the relationship between the light-extraction efficiency (%) and the refractive index of a scattering material. In the following, for simplicity, calculation was made dividing the organic layer and the translucent electrode into three parts, the electron-injection-transport layer and the light-emitting layer, the hole-injection-transport layer, and the translucent electrode. Here, in the above graph, calculation was made for the electron-injection-transport layer (thickness: 1 µm, refractive index: 1.9), the light-emitting layer (thickness: 1 µm, refractive index 1.9), the hole-injection-transport layer (thickness: 1 µm, refractive index 1.9), the scattering layer (thickness: 30 µm, refractive index of the base material: 2.0, the size of the scattering material: 2 µm, the number of the scattering materials: about 36,000,000, the content of the scattering material: 15 vol %), the translucent electrode (thickness: 100 µm, refractive index: 1.54) and the light flux 1,000 lm divided into 100,000 rays (wavelength: 550 nm). As shown in the graph, when the difference between the refractive index (2.0) of the base material and the refractive index of the scattering material is 0.2 or more (the refractive index of the scattering material is 1.8 or less), the light-extraction efficiency can be 80% or more. This is therefore particularly preferred.

The refractive index of the translucent electrode of the invention is higher than the refractive index of the base material of the scattering layer. However, it is set in this calculation as that the refractive index of the translucent electrode is the same as the refractive index (1.9) of the hole-injection-transport layer, and the refractive index of the translucent electrode is lower than the refractive index (2.0) of the base layer of the scattering layer (here, it is calculated as that the hole-injection-transport layer and the translucent electrode are combined, and both has the refractive index of nearly about 1.9). For this reason, it is estimated that the light-extraction efficiency of the invention which is the case that the refractive index of the translucent electrode is higher than the refractive index of the base material of the scattering layer is slightly lower than the above calculation result. However, it goes without saying that that even though the refractive index of the hole-injection-transport layer (containing the translucent electrode) is higher than the refractive index of the base material of the scattering layer, the light-extraction efficiency is greatly improved as compared with the conventional light-extraction efficiency. Therefore, consideration is made using the graph obtained by the above calculation result. As shown in the graph, when the difference between the refractive index (2.0) of the base material and the refractive index of the scattering material is 0.2 or more (the refractive index of the scattering material is 1.8 or less), the light-extraction efficiency can be 80% or more. This is therefore particularly preferred. Incidentally, even when the difference between the refractive index of the base material and the refractive index of the scattering material is 0.1 (the refractive index of the scattering material is 1.9), the light-extraction efficiency can be 65% or more.

Thickness of Scattering Layer

Figure 13:
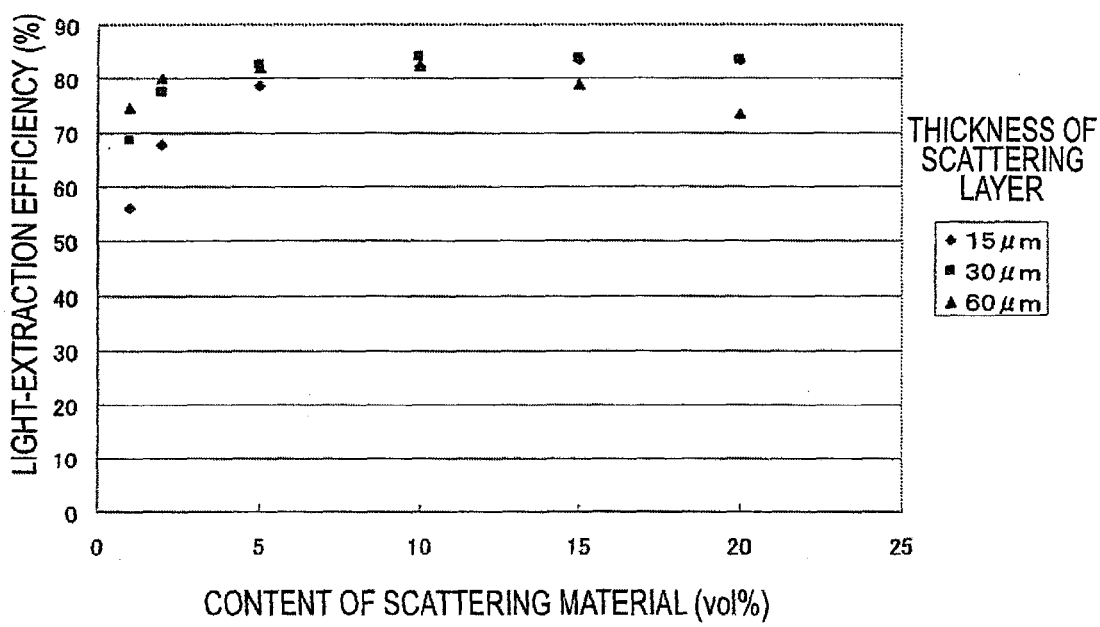
FIG. 13 is a graph showing the relationship between the light-extraction efficiency (%) and the content (vol %) of a scattering material.

FIG. 13 is a graph showing the relationship between the light-extraction efficiency (%) and the content (vol %) of a scattering material. In the following, for simplicity, calculation was made dividing the organic layer and the translucent electrode into three parts, the electron-injection-transport layer and the light-emitting layer, the hole-injection-transport layer, and the translucent electrode. Here, in the above graph, calculation was made for the electron-injection-transport layer (thickness: 1 µm, refractive index: 1.9), the light-emitting layer (thickness: 1 µm, refractive index: 1.9), the hole-injection-transport layer (thickness: 1 µm, refractive index: 1.9), the scattering layer (the refractive index of the base material: 2.0, the size of the scattering material: 2 µm, the refractive index of the scattering material: 1.0), the translucent electrode (thickness: 100 µm, refractive index: 1.54) and the light flux 1,000 lm divided into 100,000 rays (wavelength: 550 nm).

The refractive index of the translucent electrode of the invention is higher than the refractive index of the base material of the scattering layer. However, it is set in this calculation as that the refractive index of the translucent electrode is the same as the refractive index (1.9) of the hole-injection-transport layer, and the refractive index of the translucent electrode is lower than the refractive index (2.0) of the base layer of the scattering layer. For this reason, it is estimated that the light-extraction efficiency of the invention which is the case that the refractive index of the translucent electrode is higher than the refractive index of the base material of the scattering layer is slightly lower than the above calculation result. However, it goes without saying that that even though the refractive index of the hole-injection-transport layer (containing the translucent electrode) is higher than the refractive index of the base material of the scattering layer, the light-extraction efficiency is greatly improved as compared with the conventional light-extraction efficiency. Therefore, consideration is made using the graph obtained by the above calculation result.

As shown in the graph, in the case where the content of the scattering material in the scattering layer is 1 vol % or more, the light-extraction efficiency can be 55% or more, even when the thickness of the scattering layer is 15 µm or less. This is therefore preferred. Further, in the case where the content of the scattering material in the scattering layer is from 5 vol % to 15 vol %, the light-extraction efficiency can be 80% or more, even when the thickness of the scattering layer is 15 µm or less, or 60 µm or more. This is therefore particularly preferred.

Number of Scattering Materials

Figure 14:
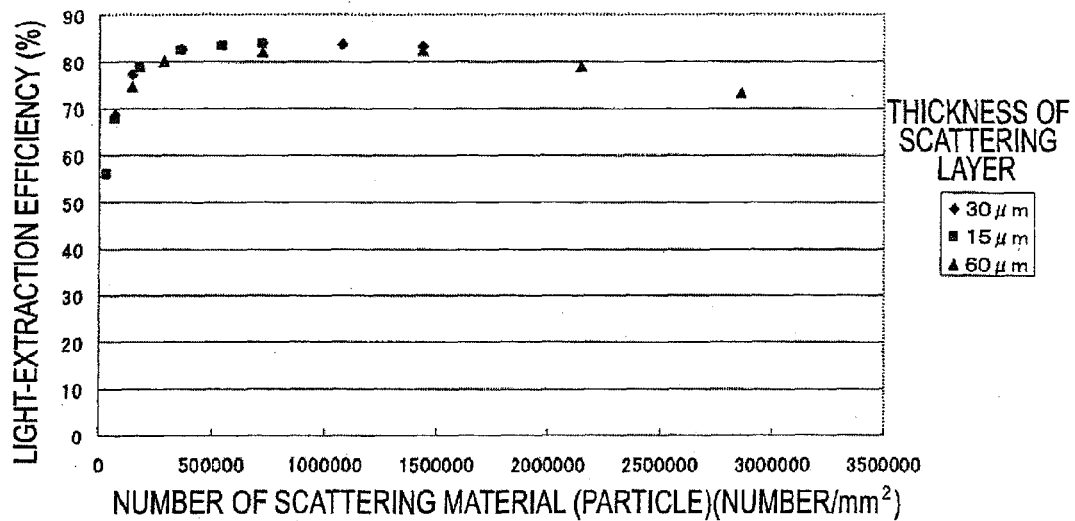
FIG. 14 is a graph showing the relationship between the light-extraction efficiency (%) and the number (number/$mm^2$) of scattering materials.

FIG. 14 is a graph showing the relationship between the light-extraction efficiency (%) and the number (number/mm$^2$) of scattering material (particles). In the following, for simplicity, calculation was made dividing the organic layer and the translucent electrode into three parts, the electron-injection-transport layer and the light-emitting layer, the hole-injection-transport layer, and the translucent electrode. Here, in the above graph, calculation was made for the electron-injection-transport layer (thickness: 1 µm, refractive index: 1.9), the light-emitting layer (thickness: 1 µm, refractive index: 1.9), the hole-injection-transport layer (thickness: 1 µm, refractive index: 1.9), the scattering layer (the refractive index of the base material: 2.0, the size of the scattering material: 2 µm, the refractive index of the scattering material: 1.0), the translucent electrode (thickness: 100 µm, refractive index: 1.54) and the light flux 1,000 lm divided into 100,000 rays (wavelength: 550 nm). As shown in the graph, it is seen that the light-extraction efficiency varies depending on the number of the scattering materials, regardless of the thickness of the scattering layer.

The refractive index of the translucent electrode of the invention is higher than the refractive index of the base material of the scattering layer. However, it is set in this calculation as that the refractive index of the translucent electrode is the same as the refractive index (1.9) of the hole-injection-transport layer, and the refractive index of the translucent electrode is lower than the refractive index (2.0) of the base layer of the scattering layer. For this reason, it is estimated that the light-extraction efficiency of the invention which is the case that the refractive index of the translucent electrode is higher than the refractive index of the base material of the scattering layer is slightly lower than the above calculation result. However, it goes without saying that that even though the refractive index of the hole-injection-transport layer (containing the translucent electrode) is higher than the refractive index of the base material of the scattering layer, the light-extraction efficiency is greatly improved as compared with the conventional light-extraction efficiency. Therefore, consideration is made using the graph obtained by the above calculation result.

In the measurement, an evaluation element was prepared. A region having a scattering layer and a region not having a scattering area are formed on the same glass substrate, and an organic LED element is formed thereon. Namely, the evaluation element has a glass substrate, a scattering layer, an ITO film, and $Alq_3$ (tris(8-quinolinolate)aluminum complex) and an Ag film. In order to compare herein the difference in the light-extraction efficiency due to the presence or absence of the scattering layer, the evaluation element was divided into to two parts of a region having a scattering layer and a region not having a scattering layer. The evaluation element of the region having a scattering layer is that the scattering layer is formed on the glass substrate. The evaluation element of the region not having a scattering layer is that an ITO film is formed on the glass substrate.

As the glass substrate, there was used a glass substrate, PD200 manufactured by Asahi Glass Co., Ltd. This glass has a strain point of 570° C. and a thermal expansion coefficient of $83 \times 10^{-7}$ (1/° C.). The glass substrate having such a high strain point and a high thermal expansion coefficient is suitable when a glass frit paste is fired to form the scattering layer.

The refractive index was measured with a refractometer (manufactured by Kalnew Optical Industrial Co., Ltd., trade name: KRP-2).

As shown in the graph, when the number of the scattering materials per 1 $mm^2$ of the scattering layer is $1 \times 10^4$ or more, the light-extraction efficiency can be 55% or more. This is therefore preferred. Further, when the number of the scattering materials per 1 $mm^2$ of the scattering layer is $2.5 \times 10^5$ or more, the light-extraction efficiency can be 75% or more. This is therefore more preferred. Furthermore, when the number of the scattering materials per 1 $mm^2$ of the scattering layer is $5 \times 10^5$ to $2 \times 10^6$, the light-extraction efficiency can be 80% or more. This is therefore particularly preferred. Here, even when the size of the scattering material is 60 µm or more and the number of the scattering materials is $3 \times 10^6$, the light-extraction efficiency can be 70% or more.

Transmittance of Base Material of Scattering Layer

Figure 15:
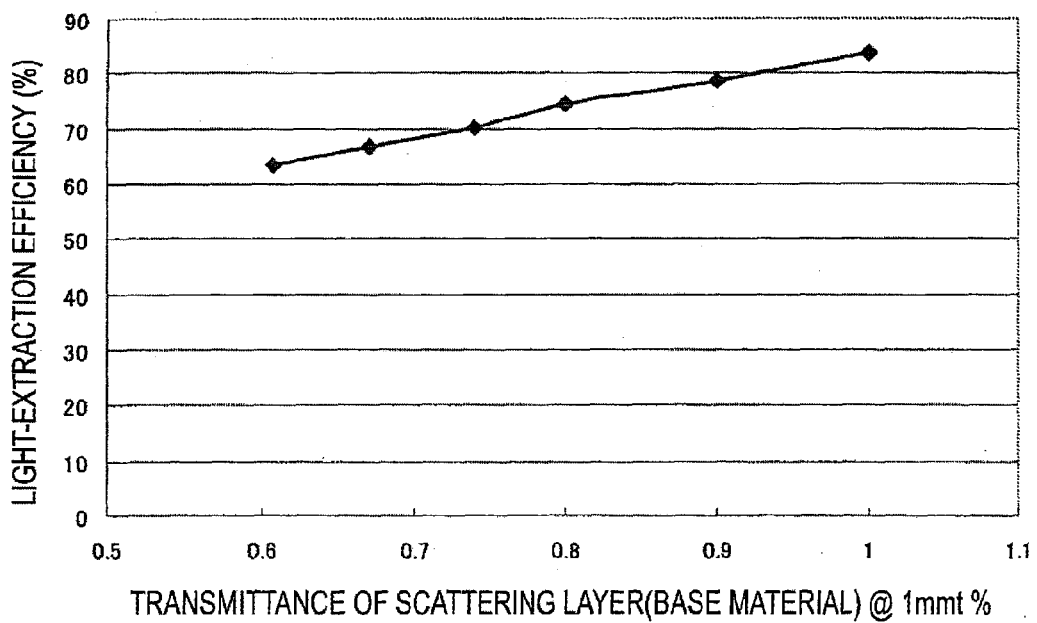
FIG. 15 is a graph showing the relationship between the light-extraction efficiency (%) and the transmittance (@1 mmt %) of a base material of the scattering layer.

FIG. 15 is a graph showing the relationship between the light-extraction efficiency (%) and the transmittance at 1 mmt % of a base material of the scattering layer. In the following, for simplicity, calculation was made dividing the organic layer and the translucent electrode into three parts, the electron-injection-transport layer and the light-emitting layer, the hole-injection-transport layer, and the translucent electrode. Here, in the above graph, calculation was made for the electron-injection-transport layer (thickness: 1 µm, refractive index: 1.9), the light-emitting layer (thickness: 1 µm, refractive index: 1.9), the hole-injection-transport layer (thickness: 1 µm, refractive index: 1.9), the scattering layer (thickness: 30 µm, the refractive index of the base material: 2.0, the size of the scattering material: 2 µm, the refractive index of the scattering material: 1.0, the number of the scattering materials: about 36,000,000, the content of the scattering material: 15 vol %), the translucent electrode (thickness: 100 µm, refractive index: 1.54) and the light flux 1,000 lm divided into 100,000 rays.

The refractive index of the translucent electrode of the invention is higher than the refractive index of the base material of the scattering layer. However, it is set in this calculation as that the refractive index of the translucent electrode is the same as the refractive index (1.9) of the hole-injection-transport layer, and the refractive index of the translucent electrode is lower than the refractive index (2.0) of the base layer of the scattering layer. For this reason, it is estimated that the light-extraction efficiency of the invention which is the case that the refractive index of the translucent electrode is higher than the refractive index of the base material of the scattering layer is slightly lower than the above calculation result. However, it goes without saying that that even though the refractive index of the hole-injection-transport layer (containing the translucent electrode) is higher than the refractive index of the base material of the scattering layer, the light-extraction efficiency is greatly improved as compared with the conventional light-extraction efficiency. Therefore, consideration is made using the graph obtained by the above calculation result.

As shown in the graph, even when the transmittance of the base material of the scattering layer is 50%, the light-extraction efficiency can be 55% or more. Further, when the transmittance of the base material of the scattering layer is 90%, the light-extraction efficiency can be 80% or more. When a glass is used as the base material, the transmittance thereof is about 98%. Accordingly, the light-extraction efficiency can exceed 80%.

Reflectivity of Cathode

Figure 16:
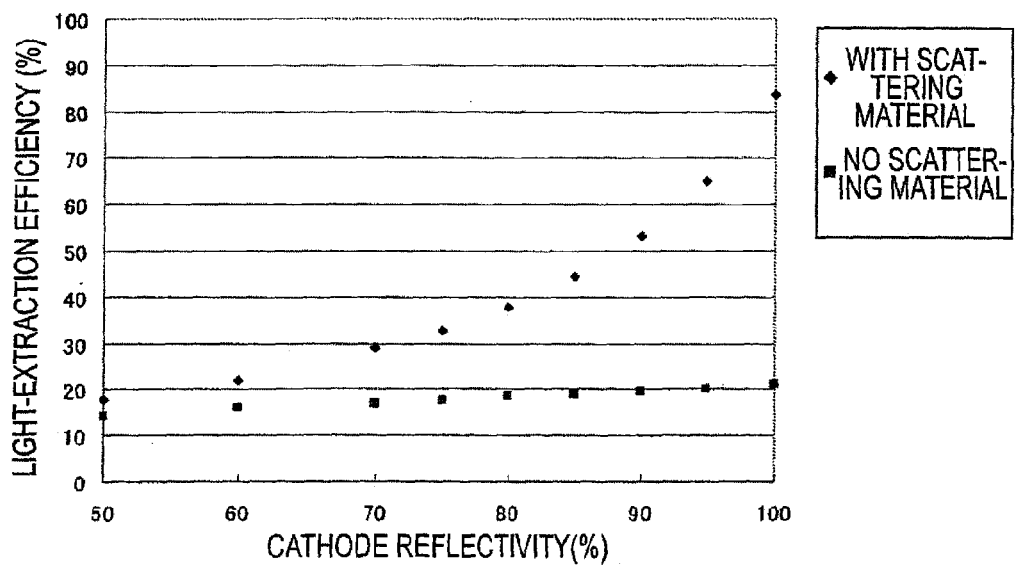
FIG. 16 is a graph showing the relationship between the light-extraction efficiency (%) and reflectivity (%) of a cathode.

FIG. 16 is a graph showing the relationship between the light-extraction efficiency (%) and the reflectivity (%) of the cathode. In the following, for simplicity, calculation was made dividing the organic layer and the translucent electrode into three parts, the electron-injection-transport layer and the light-emitting layer, the hole-injection-transport layer, and the translucent electrode. Here, in the above graph, calculation was made for the electron-injection-transport layer (thickness: 1 µm, refractive index: 1.9), the light-emitting layer (thickness: 1 µm, refractive index: 1.9), the hole-injection-transport layer (thickness: 1 µm, refractive index: 1.9), the scattering layer (thickness: 30 µm, the refractive index of the base material: 2.0, the size of the scattering material: 2 µm, the refractive index of the scattering material: 1.0, the number of the scattering materials: about 36,000,000, the content of the scattering material: 15 vol %), the translucent electrode (thickness: 100 µm, refractive index: 1.54) and the light flux 1,000 lm divided into 100,000 rays (wavelength: 550 nm).

The refractive index of the translucent electrode of the invention is higher than the refractive index of the base material of the scattering layer. However, it is set in this calculation as that the refractive index of the translucent electrode is the same as the refractive index (1.9) of the hole-injection-transport layer, and the refractive index of the translucent electrode is lower than the refractive index (2.0) of the base layer of the scattering layer. For this reason, it is estimated that the light-extraction efficiency of the invention which is the case that the refractive index of the translucent electrode is higher than the refractive index of the base material of the scattering layer is slightly lower than the above calculation result. However, it goes without saying that that even though the refractive index of the hole-injection-transport layer (containing the translucent electrode) is higher than the refractive index of the base material of the scattering layer, the light-extraction efficiency is greatly improved as compared with the conventional light-extraction efficiency. Therefore, consideration is made using the graph obtained by the above calculation result. As shown in the graph, when the reflectivity of the cathode decreases, the light-extraction efficiency also decreases. Here, the cathode reflectivity of a blue LED is from 80% to 90%, so that it is seen that the light-extraction efficiency of 40% to 50% is obtained. Here, the reflectivity of the organic LED element of Patent Document 1 is assumed to be 100%, and the light-extraction efficiency thereof is about 50%. On the other hand, when the reflectivity of the organic LED element of the invention is taken as 100% and the same conditions as in the reflectivity of the organic LED element of Patent Document 1 are applied, the light-extraction efficiency thereof exceeds 80%, as seen from the graph. Namely, it is seen that the light-extraction efficiency of the organic LED element of the invention is 1.6 times better than the light-extraction efficiency of the organic LED element of Patent Document 1. Accordingly, the organic LED of the invention can be used as a light source for lighting in place of a fluorescent lamp.

Refractive Indexes of Scattering Layer and Anode

Figure 17:
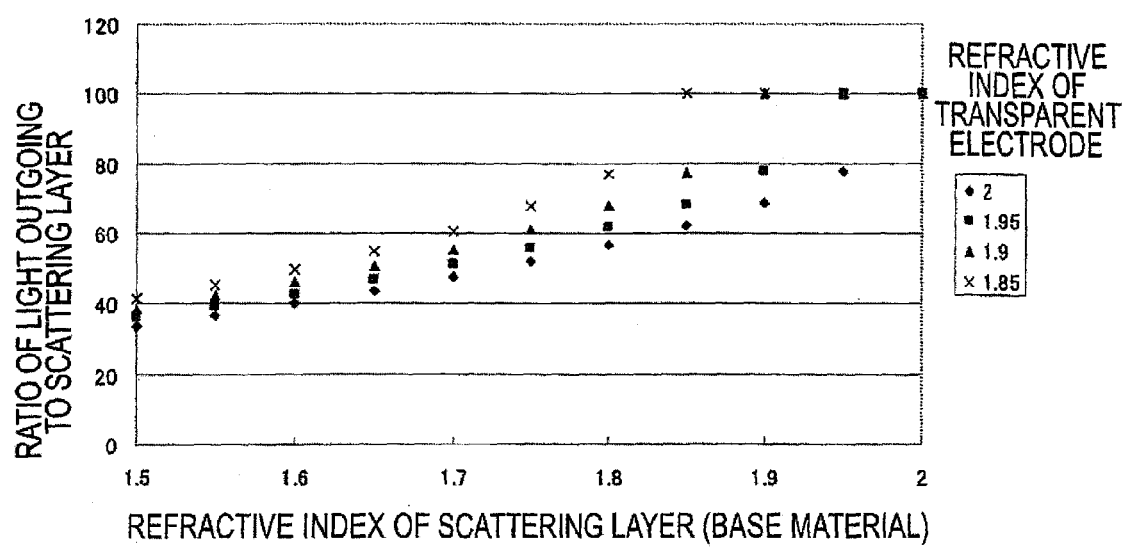
FIG. 17 is a graph showing the relationship between the ratio of light outgoing to the scattering layer and the refractive index of the base material of the scattering layer.
Figure 18:
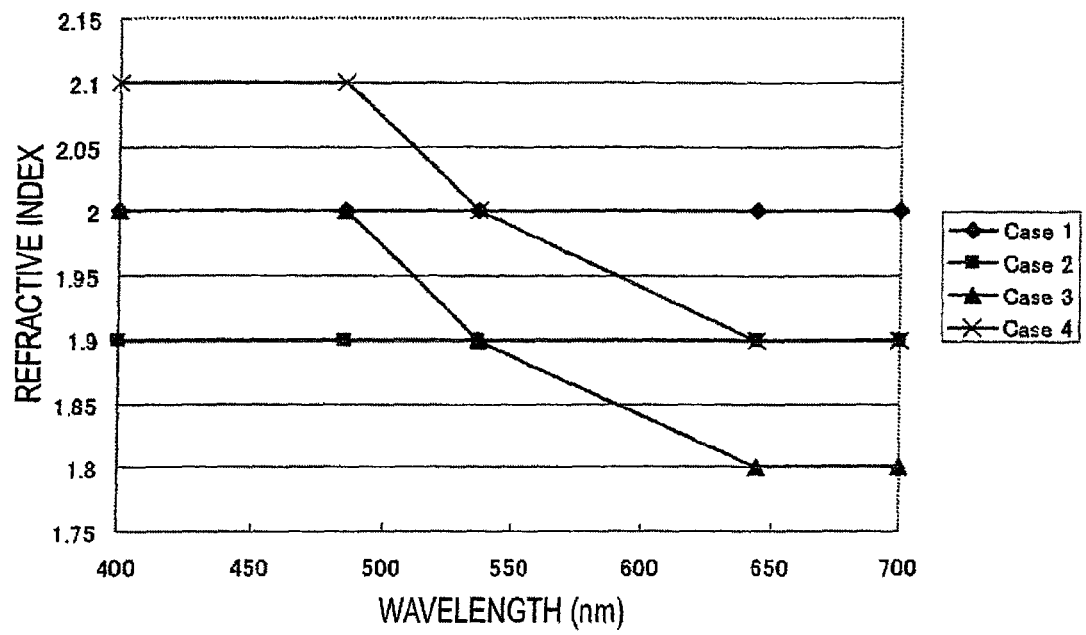
FIG. 18 is a graph showing the relationship between the wavelength and the refractive index of the base material of the scattering layer.
Figure 19:
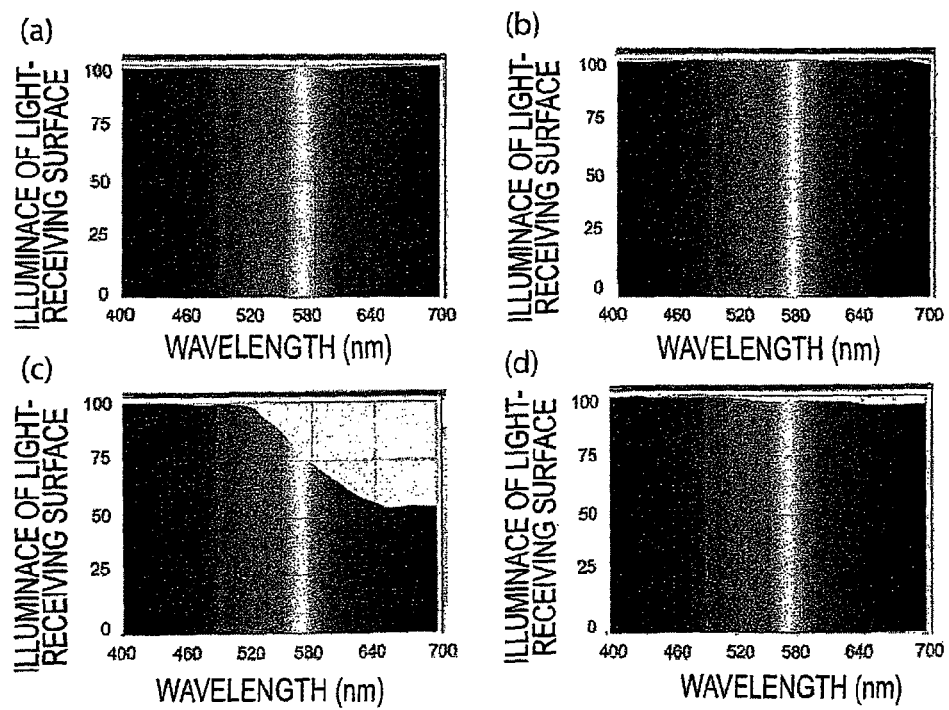
FIG. 19 shows the results of simulation of the relationship between the wavelength and the illuminance of a light receiving surface.

FIG. 17 is a graph showing the relationship between the ratio of light outgoing to the scattering layer and the refractive index of the base material of the scattering layer. In the following, for simplicity, calculation was made dividing the organic layer and the translucent electrode into three parts, the electron-injection-transport layer and the light-emitting layer, the hole-injection-transport layer, and the translucent electrode. Here, in the above graph, calculation was made for the electron-injection-transport layer (thickness: 1 μm, refractive index: 1.9), the light-emitting layer (thickness: 1 μm, refractive index: 1.9), the hole-injection-transport layer (thickness: 1 μm, refractive index: 1.9), the scattering layer (thickness: 30 μm, the size of the scattering material: 2 μm, the refractive index of the scattering material: 1.0, the number of the scattering materials: about 36,000,000, the content of the scattering material: 15 vol %), the translucent electrode (thickness: 100 μm, refractive index: 1.54) and the light flux 1,000 lm divided into 100,000 rays (wavelength: 550 nm). As shown in the graph, when the refractive index of an anode is larger than the refractive index of the scattering layer, it is seen that light of 40% can be extracted. In particular, when the refractive difference between the anode and the scattering layer is 0.2 or less, light of 50% can be extracted. Accordingly, it goes without saying that the refractive index of the scattering material of the invention may be equivalent to or higher than the refractive index of the anode.

Measuring Methods of Refractive Index of Scattering Layer

There are the following two methods for measuring the refractive index of the scattering layer. One is a method of analyzing composition of the scattering layer, thereafter preparing a glass having the same composition, and evaluating the refractive index by a prism method. The other is a method of polishing the scattering layer as thin as 1 to 2 μm, and performing ellipsometry in a region of about 10 μm in size having no pores to evaluate the refractive index. Incidentally, in the invention, it is assumed that the refractive index is evaluated by the prism method.

Surface Roughness Ra of Scattering Layer

The scattering layer has a main surface on which the translucent electrode is provided. As described above, the scattering layer of the invention contains the scattering material. As described above, when the size of the scattering material is large, even the smaller content thereof can improve the light-extraction efficiency. However, according to experiments of the inventors, there is a tendency that the larger the size is, the larger the arithmetic average roughness (surface roughness: Ra) of the main surface of the scattering layer becomes, when projected from the main surface of the scattering layer. As described above, the translucent electrode is provided on the main surface of the scattering layer. Accordingly, there is a problem that the larger arithmetic average roughness (Ra) of the main surface of the scattering layer causes a short circuit between the translucent electrode and the scattering layer, resulting in no light emission of the organic EL element. The above-mentioned Patent Document 1 discloses, in paragraph 0010, that the unevenness formed on the substrate poses a problem even when it is about several microns. However, according to the experiments by the inventors, it has been proved that light emission of the organic EL element is not obtained in the case of several microns.

Translucent Electrode

The translucent electrode (anode) 103 is required to have a translucency of 80% or more, in order to extract the light generated in the organic layer 110 to the outside. Further, in order to inject many holes, one having a high work function is required. Specifically, there is used a material such as ITO, $SnO_2$, ZnO, IZO (indium zinc oxide), AZO ($Zn-Al_2O_3$; a zinc oxide doped with aluminum), GZO ($ZnO-Ga_2O_3$; a zinc oxide doped with gallium), Nb-doped $TiO_2$ or Ta-doped $TiO_2$. The thickness of the anode 103 is preferably 100 nm or more. Incidentally, the refractive index of the anode 103 is from 1.9 to 2.2. Here, an increase in carrier concentration can decrease the refractive index of ITO. ITO is commercially available as a standard containing 10 wt % of $SnO_2$. The refractive index of ITO can be decreased by increasing the Sn concentration more than this. However, although the carrier concentration is increased by an increase in the Sn concentration, the mobility and transmittance are decreased. It is therefore necessary to determine the Sn amount, achieving a balance of these. Here, the refractive index of ITO is preferably determined by considering the refractive index of the base material 105 constituting the scattering layer 102 and the refractive index of the reflective electrode 120. Considering waveguide calculation, the reflectivity of the reflective electrode 120, and the like, the difference between the refractive index of ITO and the refractive index of the base material 105 is 0.2 or less, and is preferably high.

Incidentally, it goes without saying that the translucent electrode may be used as the cathode.

Organic Layer (Layer Having Light-Emitting Function)

The organic layer 110 is a layer having a light-emitting function and comprises a hole-injection layer 111, a hole-transport layer 112, a light-emitting layer 113, an electron-transport layer 114 and an electron-injection layer 115. The refractive index of the organic layer 110 is from 1.7 to 1.8.

Hole-Injection Layer

As the hole-injection layer 111, one whose ionization potential is not so different from the anode 103 is required, in order to lower a hole-injection barrier. An improvement of charge-injection efficiency from an electrode interface in the hole-injection layer 111 decreases the driving voltage of the element and increases charge-injection efficiency thereof. There is widely used polyethylenedioxythiophene doped with polystyrene sulfonic acid (PSS) (PEDOT:PSS) as a polymer, and copper phthalocyanine (CuPc) of the phthalocyanine family as a low-molecular substance.

Hole-Transport Layer

The hole-transport layer 112 plays a role to transport holes injected from the hole-injection layer 111 to the light-emitting layer 133. As the hole-transport layer 112, there is used, specifically, a triphenylamine derivative, N,N'-bis(1-naphthyl)-N,N'-diphenyl-1,1'-biphenyl-4,4'-diamine (NPD), N,N'-diphenyl-N,N'-[N-phenyl-N-(2-naphthyl)-4'-aminobiphenyl-4-yl]-1,1'-biphenyl-4,4'-diamine (NPTE), 1,1-bis [(di-4-tolylamino)phenyl]cyclohexane (HTM2), N,N'-diphenyl-N,N'-bis(3-methylphenyl)-1,1'-diphenyl-4,4'-diamine (TPD) or the like. The thickness of the hole-transport layer 112 is preferably from 10 nm to 150 nm. The thinner the thickness is, the lower the voltage can be. However, it is particularly preferably from 10 nm to 150 nm, in terms of a problem of the interelectrode short circuit.

Light-Emitting Layer

The light-transmitting layer 113 provides a field in which injected electrons and holes recombine with each other, and a material having high light-emitting efficiency is used. To describe in detail, a light-emitting host material and a doping material of a light-emitting dye used in the light-emitting layer 113 function as recombination centers of the holes and the electrons injected from the anode and the cathode. Further, doping of the host material in the light-emitting layer with the light-emitting dye provides high light-emitting efficiency, and converts the light-emitting wavelength. These are required to have a suitable energy level for charge injection, to be excellent in chemical stability and heat resistance, and to form a homogeneous amorphous film. Further, these are required to be excellent in the kind of emission color and color purity, and to have high light-emitting efficiency. The organic light-emitting materials include low-molecular and polymer materials. Further, they are classified into fluorescent and phosphorescent materials according to the light-emitting mechanism. Specifically, the light-emitting layer 113 includes metal complexes of quinoline derivatives such as tris(8-quinolinolate)aluminum complex ($Alq_3$), bis(8-hydroxy)quinaldine aluminum phenoxide ($Alq'_2OPh$), bis(8-hydroxy)quinaldine aluminum 2,5-dimethylphenoxide (BAlq), a mono(2,2,6,6-tetramethyl-3,5-heptanedionate)-lithium complex (Liq), a mono(8-quinolinolate)sodium complex (Naq), a mono(2,2,6,6-tetramethyl-3,5-heptanedionate) lithium complex, a mono(2,2,6,6-tetramethyl-3,5-heptanedionate)-sodium complex and a bis(8-quinolinolate) calcium complex ($Caq_2$), and fluorescent substances such as tetraphenylbutadiene, phenylquinacridone (QD), anthracene, perylene and coronene. As the host material, preferred is a quinolinolate complex, and particularly preferred is an aluminum complex having 8-quinolinol or a derivative thereof as a ligand.

Electron-Transport Layer

The electron-transport layer 114 plays a role to transport holes injected from the electrode. As the electron-transport layer 114, there is used, specifically, a quinolinol aluminum complex ($Alq_3$), an oxadiazole derivative (for example, 2,5-(bis(1-naphthyl-1,3,4-oxadiazole (BND), 2-(4-t-butylphenyl)-5-(4-biphenyl)-1,3,4-oxadiazole (PBD) or the like), a triazole derivative, a bathophenanthroline derivative, a silole derivative or the like.

Electron-Injection Layer

As the electron-injection layer 115, one which increases electron injection efficiency is required. Specifically, a layer doped with an alkali metal such as lithium (Li) or cesium (Cs) is provided on a cathode interface, as the electron-injection layer 115.

Reflective Electrode

As the reflective electrode (cathode) 120, a metal having a small work function or an alloy thereof may be used. Specifically, examples of the cathode 120 include an alkali metal, an alkaline earth metal, and a metal of group 3 in the periodic table. Of these, aluminum (Al), magnesium (Mg), an alloy thereof or the like is preferably used. Further, as a cathode 120, a co-vapor-deposited film of Al and MgAg, a laminated electrode in which Al is vapor-deposited on a thin vapor-deposited film of LiF or Li2O, or the like may be used. Further, in system using a polymer, a laminate of calcium (Ca) or barium (Ba) and aluminum (Al), or the like may be used as the cathode 120.

Incidentally, it goes without saying that the reflective electrode may be used as the anode.

Process for Producing Translucent Electrode-Attached Translucent Substrate (Laminate for Organic LED Element)

Figure 20:
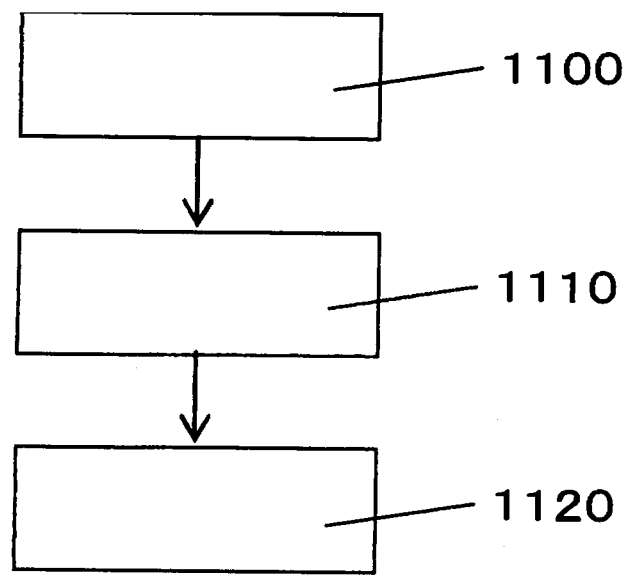
FIG. 20 is a flow chart showing a process for producing a substrate for an organic LED element of the invention.

The process for producing the translucent electrode-attached translucent substrate of the invention will be described below with reference to the drawing. FIG. 20 is a flow chart showing a process for producing the translucent electrode-attached substrate of the invention. The process for producing the translucent electrode-attached substrate of the invention comprises the step of preparing a translucent substrate (step 1100), the step of forming on the translucent substrate a scattering layer comprising a base material having a first refractive index at a wavelength of emitted light of an organic LED element and a plurality of scattering materials provided in the inside of the base material and having a refractive index different from that of the base material (step 1110), and the step of forming on the scattering layer a translucent electrode having a second refractive index higher than the first refractive index (step 1120).

First, the translucent substrate is prepared (step 1100). Specifically, a glass substrate or a plastic substrate is used as the translucent substrate.

Then, there is prepared a scattering layer-forming material comprising the base material having a first refractive index at a wavelength of emitted light of the organic LED element and a plurality of scattering materials provided inside the base material and having a refractive index different from that of the base material. Then, by coating the scattering layer-forming material prepared and firing the same, the scattering layer in which the scattering materials have uniformly been distributed in the plane is formed on the translucent substrate (step 1110).

Then, the translucent electrode having a third refractive index equal to or higher than the first refractive index is formed on the scattering layer (step 1120). To describe it specifically, an ITO film is formed on the substrate, and the ITO film is etched, thereby forming the translucent electrode. The film formation of ITO can be uniformly performed over the whole surface of the glass substrate by sputtering or vapor deposition. An ITO pattern is formed by photolithography and etching. This ITO pattern becomes the translucent electrode (anode). A phenol novolak resin is used as a resist, and exposure and development are conducted. The etching may be either wet etching or dry etching. For example, patterning of ITO can be performed by using a mixed aqueous solution of hydrochloric acid and nitric acid. As a resistor remover, there can be used, for example, monoethanolamine.

Process for Producing Organic LED Element

Figure 21:
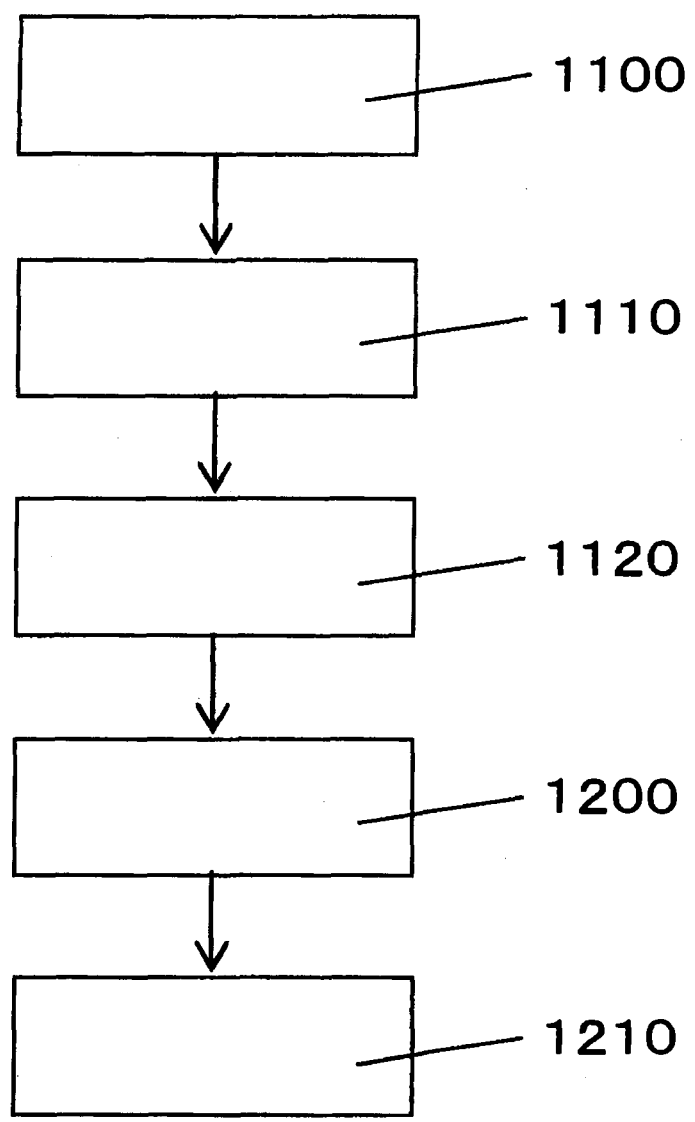
FIG. 21 is a flow chart showing a process for producing an organic LED element of the invention.

The process for producing the organic LED element of the invention will be described below by using the drawing. FIG. 21 is a flow chart showing a process for producing the organic LED element of the invention. The process for producing the organic LED element of the invention comprises a step of preparing a translucent substrate (step 1100), a step of forming on the translucent substrate a scattering layer comprising a base material having a first refractive index at a wavelength of emitted light of the organic LED element and a plurality of scattering materials provided in the inside of the base material and having a refractive index different from that of the base material (step 1110), a step of forming on the scattering layer a translucent electrode having a third refractive index higher than the first refractive index (step 1120), a step of forming an organic layer on the translucent electrode (step 1200), and a step of forming a reflective electrode on the organic layer (step 1210).

After steps 1100 to 1120 have been performed, the organic layer is formed on the translucent electrode (step 1200). The organic layer is formed herein by a combination of a coating method and a vapor deposition method. For example, when some one or more of the organic layers are formed by the coating method, the other layers are formed by the vapor deposition method. When the layer is formed by the coating method and the upper layer is formed thereon by the vapor deposition method, condensation, drying and curing are performed before the organic layer is formed by the vapor deposition method. Further, the organic layer may be formed by only the coating method or only the vapor deposition method.

Then, the reflective electrode is formed on the organic layer (step 1210). To describe it specifically, a metal material such as aluminum is vapor-deposited on the organic layer, thereby forming the reflective electrode.

Next, there will be described the step of producing an opposed substrate for sealing, in order to seal the organic EL light-emitting element formed by the above steps. First, a glass substrate different from the element substrate is prepared. This glass substrate is processed to form a desiccant housing portion for housing a desiccant. The glass substrate is coated with a resist, and a part of the substrate is exposed by exposure and development to form the desiccant housing portion. This exposed portion is made thin by etching, thereby forming the desiccant housing portion.

Figure 22:
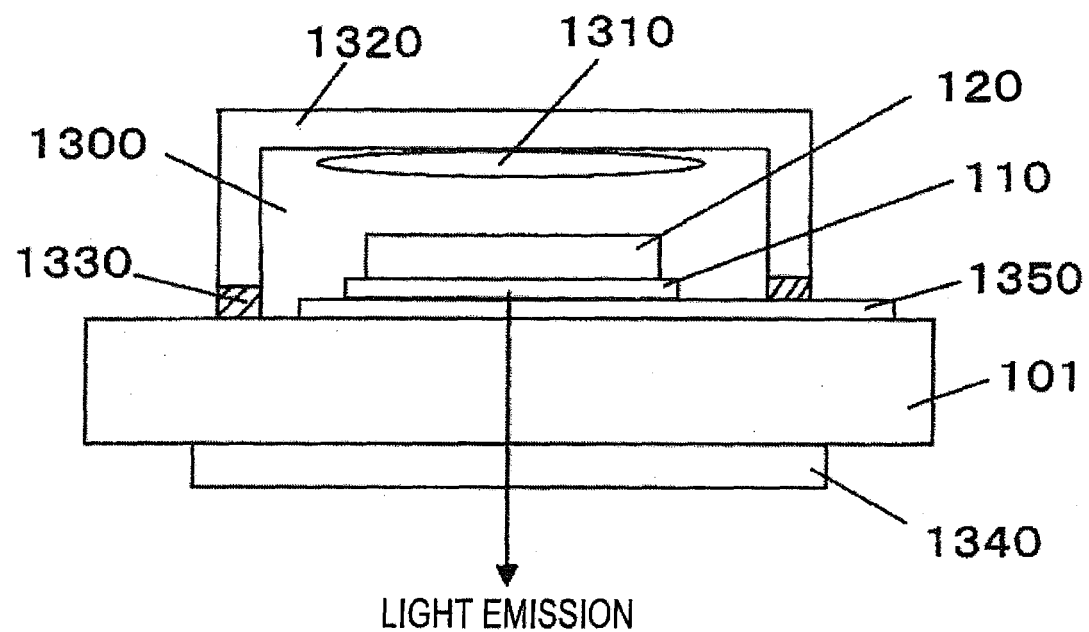
FIG. 22 is a cross-sectional view schematically showing a constitution of an organic EL display device.

As shown in FIG. 22, the desiccant 1310 such as calcium oxide is disposed in this desiccant housing portion 1300, and then, two substrates are laminated and adhered to each other. Incidentally, FIG. 22 is a cross-sectional view schematically showing a constitution of an organic EL display device. Specifically, a seal material 1330 is applied to a surface of the opposed substrate 1320 on which the desiccant housing portion 1300 is provided, by using a dispenser. As the seal material 1330, there can be used, for example, an epoxy-based UV-curable resin. Further, the seal material 1330 is applied to the whole periphery of a region facing to the organic LED element. The two substrates are aligned, allowed to face each other, and then, irradiated with UV light to cure the seal material, thereby adhering the substrates to each other. Thereafter, in order to more enhance the curing of the seal material, for example, heat treatment is performed in a clean oven of 80° C. for 1 hour. As a result of this, a space between the substrates in which the organic EL element is present is isolated from the outside of the substrates by the seal material and the pair of substrates. Deterioration of the organic EL element due to water and the like remaining in the sealed space or entering therein can be prevented by disposing the desiccant 1310.

Light emission from the organic layer 110 is outgone in a direction of the arrow. An optical sheet 1340 is attached to a surface of the substrate 101 opposite to a surface on which the organic LED element is formed, namely, an outgoing surface. The optical sheet 1340 has a polarizing plate and a ¼ wavelength plate, and functions as an antireflective film. The light from the organic thin film layer is extracted to the side of the surface on which this optical sheet 1340 is provided.

Unnecessary portions in the vicinity of the periphery of the substrate are cut and removed. A signal electrode driver is connected to anode wiring 1350, and a scanning electrode driver is connected to cathode connection wiring. At an end portion of the substrate, a thermal portion connected to each wiring is formed. An anisotropically-conductive film (ACF) is attached to this terminal portion, and a TCP (tape carrier package) provided with a driving circuit is connected thereto. Specifically, the AFC is temporarily pressed on the terminal portion. Then, the TCP containing the driving circuit is securely pressed on the terminal portion. The driving circuit is mounted thereby. This organic EL display panel is attached to a box to complete the organic EL display device. Although the above shows the case of a dot matrix display element, character display may be used. This is not limited to the above constitution depending on the element specification.

Embodiment 2

Another Constitutional Example of Organic LED Element

Figure 23:
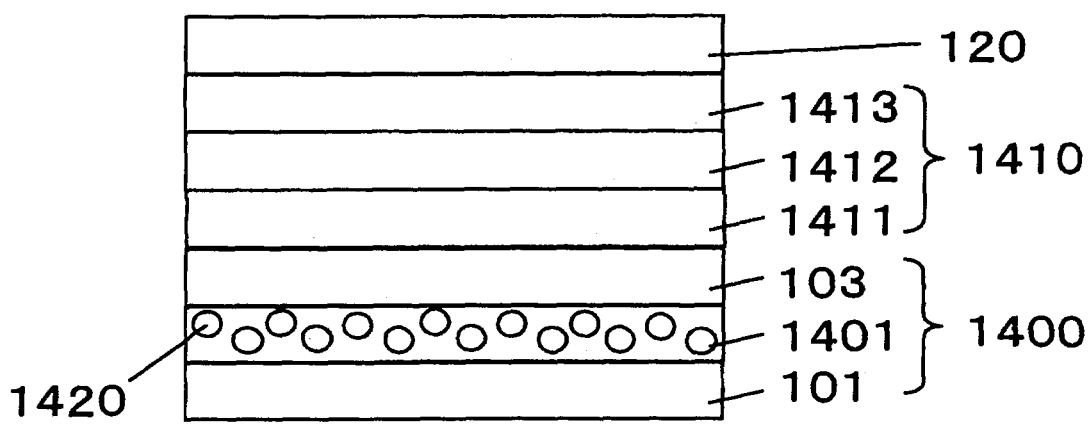
FIG. 23 is a cross-sectional view showing other structures of a laminate for an organic LED element and an organic LED element of the invention.

Then, constitutions of the electrode-attached translucent substrate (laminate for an organic LED element) and the laminate for an organic LED element of embodiment 2 of the invention will be described below with reference to the drawings. Incidentally, the same reference numbers are given to the same constitutions as those in FIG. 1, and descriptions thereof will be omitted. FIG. 23 is a cross-sectional view showing other structures of the laminate for an organic LED element and the laminate for an organic LED element of the invention. The other organic LED element of the invention is constituted by an electrode-attached translucent substrate (laminate for an organic LED element) 1400, an organic layer 1410 and a reflective electrode 120. The electrode-attached translucent substrate 1400 is constituted by a translucent substrate 101, a scattering layer 1401 and a translucent electrode 103. The organic layer 1410 is constituted by a hole-injection-transport layer 1411, a light-emitting layer 1412 and an electron-injection-transport layer 1413.

The light-emitting layer 113 of the organic LED element of FIG. 1 is constituted by three layers therein. Any one of the three layers is formed so as to emit light of any of three light emission colors (red, green and blue). However, the light-emitting layer 1412 of the organic LED element of FIG. 23 can be constituted by one layer emitting only the blue light by using a fluorescent emission material (for example, a filler) emitting red light and green light as a plurality of scattering materials 1420 provided in the inside of the scattering layer 1401. Namely, according to the other constitution of the organic LED element of the invention, a layer emitting light of any one color of red, green and blue can be used as the light-emitting layer to achieve an effect that the organic LED element can be downsized.

In the above embodiments, descriptions have been made for the constitution in which the organic layer is sandwiched between the translucent electrode and the reflective electrode. However, a bifacial light emission type organic EL layer may be constituted by making both electrodes translucent.

Further, the translucent electrode-attached translucent substrate of the invention is effective to increase the efficiency of optical devices such as various light-emitting devices such as inorganic EL elements and liquid crystals and light-receiving devices such as light quantity sensors and solar cells, without being limited to the organic EL elements.

Examples

Experimental Proof for Effect of Scattering Layer

An experimental proof for showing that the scattering layer is effective for an improvement of the light-extraction efficiency will be described below. Sample 1 is an example having the scattering layer of the invention, and Sample 2 is a comparative example having the scattering layer in the inside of which no scattering material is provided. The calculating method is the same as the calculating method of the scattering layer described above. The respective conditions and results (front extraction efficiency) are shown in Table 2 below.

TABLE 2

|  | Sample 1 | Sample 2 |
|---|---|---|
| Electron-Injection-Transport Layer |  |  |
| Thickness (μm) | 1 | 1 |
| Refractive Index | 1.9 | 1.9 |
| Light-Emitting Layer |  |  |
| Thickness (μm) | 1 | 1 |
| Refractive Index | 1.9 | 1.9 |
| Hole-Injection-Transport Layer |  |  |
| Thickness (μm) | 1 | 1 |
| Refractive Index | 1.9 | 1.9 |
| Scattering Layer |  |  |
| Base Material |  |  |
| Thickness (μm) | 30 | 30 |
| Refractive Index | 1.9 | 1.9 |
| Transmittance (%) | 100 | 100 |
| Scattering Material |  |  |
| Size (μm) | 5 | — |
| Refractive Index | 1 | — |
| Number of Particles (@1 mm$^2$) | 1527932.516 | — |
| Content (vol %) | 10 | — |
| Transmittance (%) | 100 | — |
| Glass Substrate |  |  |
| Thickness (μm) | 100 | — |
| Refractive Index | 1.54 | — |
| Light Flux |  |  |
| Number of Light Rays Extracted from Front Face | 811.1/1000 | 210.4/1000 |
| Number of Light Rays Extracted from Front Face | 47.86/1000 | 125/1000 |
| Front Extraction Efficiency (%) | 81.11 | 21.04 |

Figure 24:
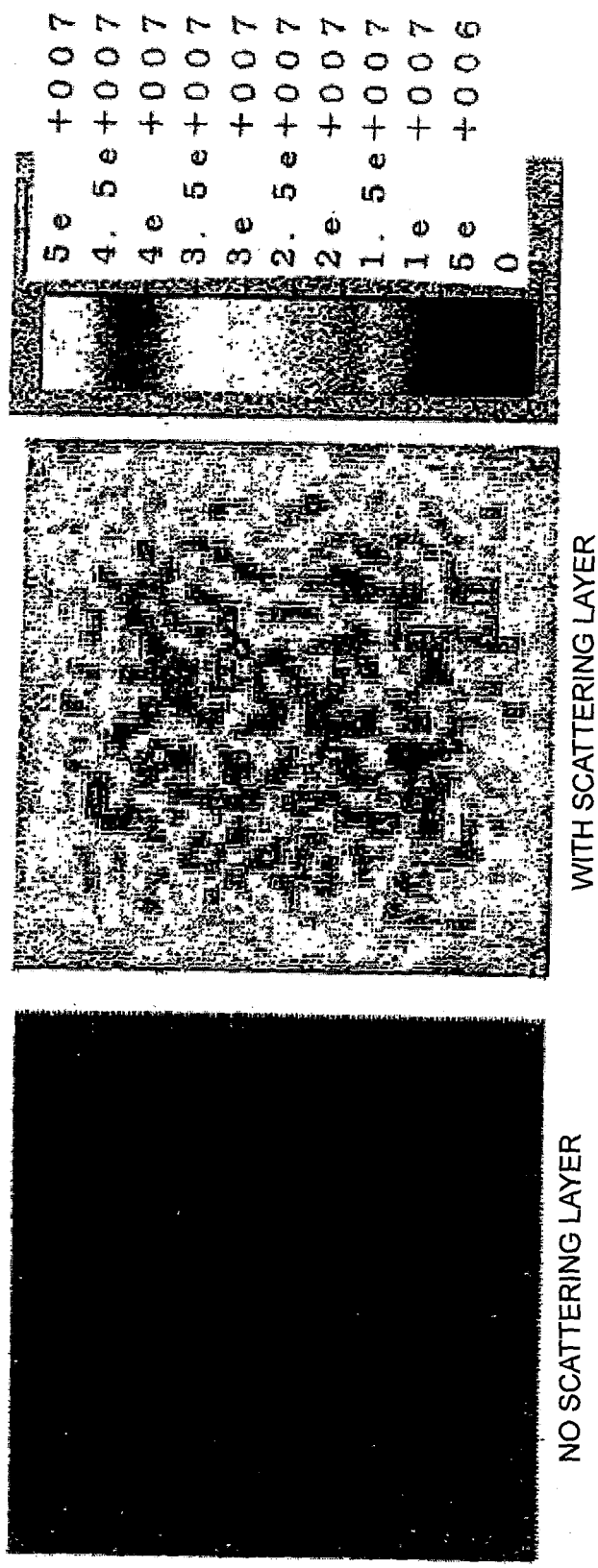
FIG. 24 shows the results of observation from the front under the conditions of Sample 1 and Sample 2.

The results of comparison of front extraction efficiency between the example and the comparative example are shown in FIG. 24. FIGS. 24(a) and 24(b) are graphs showing the results of observation from the front under conditions of samples 1 and 2, respectively. As shown in FIG. 24, according to the electrode-attached translucent substrate (laminate for an organic LED element) and the organic LED element of the LED element of the invention, it becomes possible to improve the light-extraction efficiency which is about 20% when untreated to 80%.

The refractive index of the translucent electrode of the invention is higher than the refractive index of the base material in the scattering layer. However, in this calculation, it is regarded that the refractive index of the translucent electrode is the same as the refractive index (1.9) of the hole-injection-transport layer, and the refractive index of the translucent electrode is lower than the refractive index (2.0) of the base material in the scattering layer. For this reason, it is presumed that the light-extraction efficiency of the present invention that is the case that the refractive index of the translucent electrode is higher than the refractive index of the base material in the scattering layer is slightly lower than the above calculation result. However, it goes without saying that even though the refractive index of the hole-injection-transport layer (containing the translucent electrode) is higher than the refractive index of the base material in the scattering layer, the light-extraction efficiency is greatly improved as compared with the conventional light-extraction efficiency. Therefore, consideration is made using the above table.

Experimental Proof between Refractive Index of Base Material in Scattering Layer and Refractive Index of Translucent Electrode Using the drawing, the simulation result in which the relationship between the refractive index of the base material in the scattering layer and the refractive index of the translucent electrode has been considered from the waveguide standpoint is shown below. The consideration from waveguide standpoint used herein means that the proportion of existence of mode which is permitted to exist in the inside of the translucent electrode is calculated. Specifically, light was entered in the organic layer from the outside, and it was calculated as to what extent of the light transfers to the translucent electrode from the organic layer and propagates in the translucent electrode without leakage.

Figure 25:
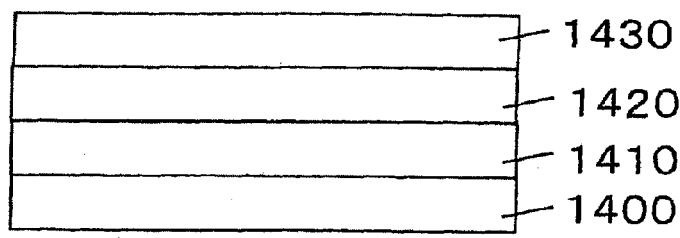
FIG. 25 is a view showing a model for simulation.

FIG. 25 is a cross-sectional view of a sample of the organic LED element assumed in performing the simulation. The organic LED element of the sample comprises the scattering layer 1400 having a high refractive index, the translucent electrode 1410 provided on the scattering layer 1400, the organic layer 1420 provided on the translucent electrode 1410, and the reflective electrode 1430 provided on the organic layer 1420. Here, the scattering layer 1400 was a glass having a refractive index of 2.0. In order to note the relationship between the refractive index of the base layer in the scattering layer and the refractive index of the translucent electrode, the scattering layer 1400 was constituted by only the base material, and did not contain a scattering material. In order to obtain high light-extraction efficiency, the fact remains that the scattering material is an important element. Because the thickness of the scattering layer is sufficiently large as compared with that of the organic layer and the translucent electrode, the thickness of the scattering layer was not considered. The translucent electrode 1410 had a thickness of 0.1 to 0.8 pun and a refractive index of 1.96 to 2.2. The organic layer 1420 had a thickness of 0.15 μm and a refractive index of 2.0. The actual organic layer 1420 is a laminate comprising a plurality of layers. However, in order to note the relationship between the refractive index of the base layer in the scattering layer and the refractive index of the translucent electrode, a single layer was used. The reflective electrode 1430 had a refractive index of 1.0. The actual reflective electrode 1430 is a metal such as aluminum. However, in order to note the relationship between the refractive index of the base layer in the scattering layer and the refractive index of the translucent electrode, the reflective electrode had the refractive index of 1.0. Further, because the reflectivity does not depend on a thickness, the thickness of the reflective electrode 1430 was not considered.

The model assumed as above was calculated using BPM method (Beam Propagation Method). Here, the calculating wavelength was 470 nm, the mode of light entering the organic layer was Gaussian mode, the output monitor showing the calculation result was light intensity present in the translucent electrode, the calculating steps were X=0.01 μm, Y=0.005 µm and Z=0.5 µm, and the calculation regions were X: ±4 µm, Y: +4 µm, −2 µm, and Z: +1000 µm. The result is shown in the drawing.

Figure 26:
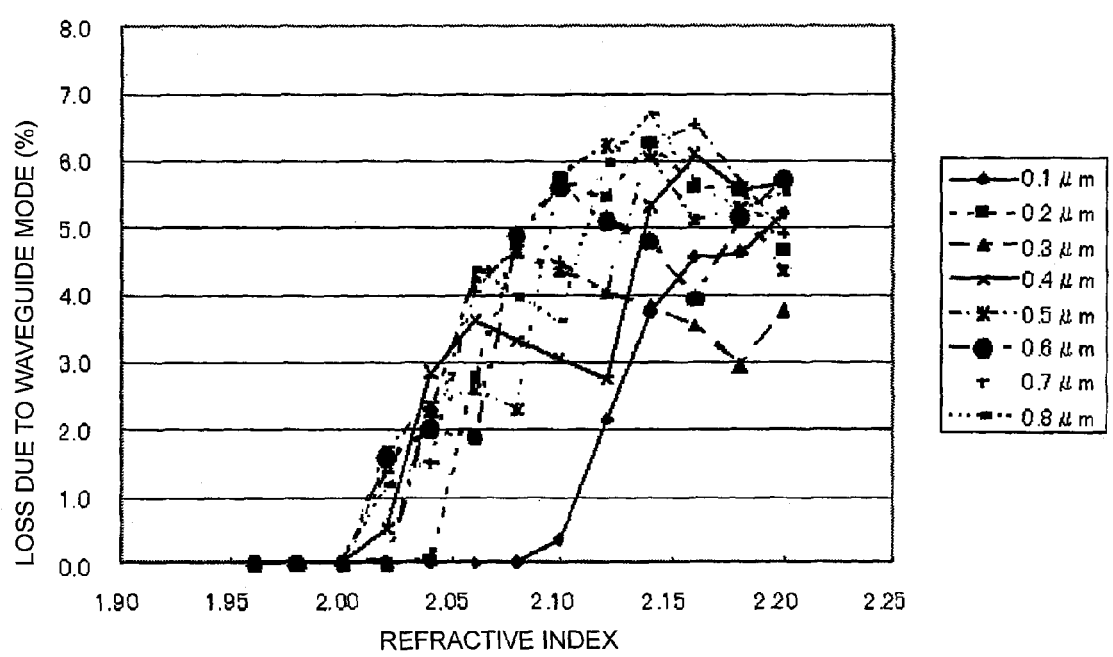
FIG. 26 is a graph showing the results of simulation.
Figure 27:
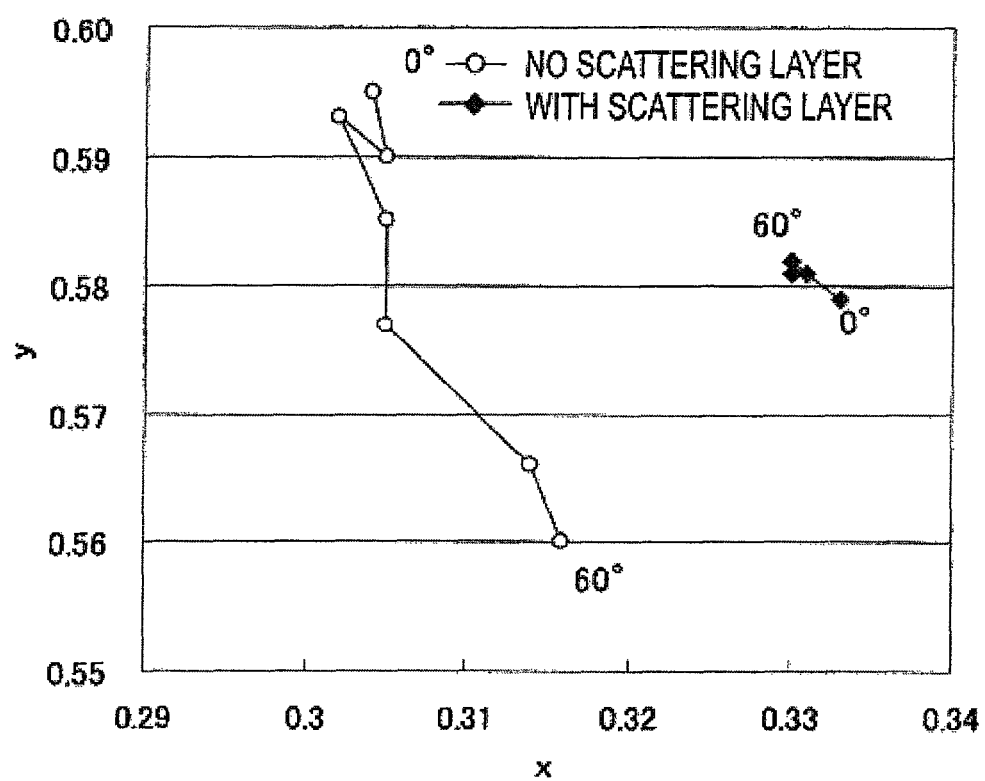
FIG. 27 is a graph showing the relationship between the depth and the number of pores in a scattering layer of the organic LED element of the invention.

FIG. 26 is a graph showing the result of simulation. The vertical axis of FIG. 26 is an energy amount of a waveguide mode in the translucent electrode and is an amount corresponding to extraction loss. The horizontal axis is a refractive index of the translucent electrode. As is seen from the drawing, in the case that the refractive index of the translucent electrode is equal to or lower than the refractive index of the base material in the scattering layer, loss of the waveguide mode is not seen. On the other hand, in the case that the refractive index of the translucent electrode is higher than the refractive index of the base material in the scattering layer, loss is increased with increasing the refractive index difference ($\Delta n$). The reason that data vibrate in the drawing is due to the influence that the electric field intensity in the light-receiving portion varies by the conditions, but the above tendency remains unchanged. Further, in the case that the thickness of the translucent electrode is from 0.1 µm to 0.3 µm, the refractive index of the translucent electrode causing loss is 2.10, 2.06 and 2.04, respectively. In the case that the thickness is larger than above thickness, loss is generated when the refractive index exceeds 2.0. However, when $\Delta n$ is 0.2 or less, the loss is 7% or less even though the film thickness of the translucent electrode changes, and it is possible to sufficiently maintain the effect of improving light-extraction of the scattering layer.

Generally, when the organic LED element is prepared by laminating a translucent substrate, a scattering layer, a translucent electrode, an organic layer and a reflective electrode, in this order, the refractive index difference between the scattering layer and the translucent substrate is increased with increasing the refractive index of the scattering layer, and light reflected at the interface between the scattering layer and the translucent substrate goes to the reflective electrode through the organic layer, reflects by the reflective electrode, and returns to the scattering layer. However, the reflectivity of the reflective electrode is not 100%, and light decays during repeating reflection by the reflective electrode. Thus, in the case that the reflectivity of the reflective electrode is low, when the refractive index of the base material in the scattering layer is decreased and approaches the refractive index of the substrate, reflection at the interface between the scattering layer and the substrate is decreased. As a result, light decay at the reflective electrode can be reduced. In this case, when $\Delta n$ is 0.2 or less, loss of the waveguide mode is minor, and the light-extraction efficiency can be improved. $\Delta n$ may be 0.2 or less at a certain emitting wavelength of the organic LED element, and $\Delta n$ may be 0.2 or less at all of emitting wavelengths.

Figure 28:
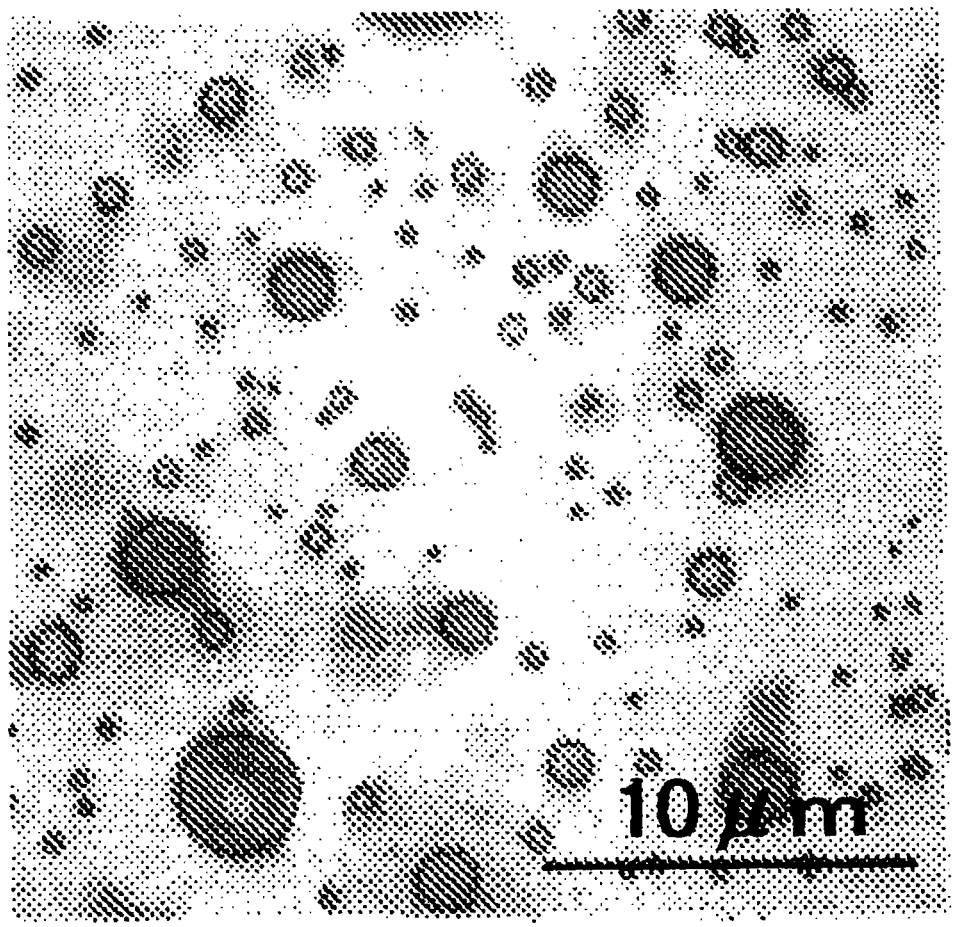
FIG. 28 is a photograph of a scattering layer of the translucent substrate in the scattering layer of the organic LED element of the invention.

Photograph of the scattering layer of the translucent substrate of the embodiment of the invention is shown in FIG. 28. FIG. 28 shows the distribution of pores when the fired glass scattering layer was observed with a microscope. The thickness of the scattering layer observed is 9 µm, and the glass composition is the same as A shown in Table 1. In FIG. 28, the contour of pores is shown by tracing the same with a circle in order to make the contour thereof understand easily. Thus, pores are distributed in a plane randomly and nearly uniformly.

Although the present invention has been described in detail and by reference to the specific embodiments, it is apparent to one skilled in the art that various modifications or changes can be made without departing the spirit and scope of the present invention.

The present application is based on Japanese Patent Application No. 2007-292522 filed on Nov. 9, 2007, the disclosure of which is incorporated herein by reference in its entity.

INDUSTRIAL APPLICABILITY

As has been described above, the electrode-attached translucent substrate of the invention has the scattering layer which is excellent in light scatterability and high in reliability, so that light-extraction efficiency or incorporation efficiency can be increased to be applicable to light-emitting devices, light-receiving devices and the like.

The invention claimed is:

1. A translucent substrate comprising:
   a translucent glass substrate;
   a scattering layer formed on the glass substrate and comprising a glass which contains:
      a base material having a first refractive index for at least one wavelength of light to be transmitted; and
      a plurality of scattering materials dispersed in the base material and having a second refractive index different from that of the base material; and
   a translucent electrode formed on the scattering layer and having a third refractive index higher than the first refractive index,
   wherein distribution of the scattering materials in the scattering layer decreases toward the translucent electrode in a vicinity of a surface at a translucent electrode side of the scattering layer.

2. The translucent electrode according to claim 1, satisfying $\rho_4 > \rho_3$, wherein $\rho_3$ is a density of the scattering materials at a distance x (x≦0.2 µm) from the surface of the scattering layer and $\rho_4$ is a density of the scattering materials at a distance x being 2 µm.

3. The translucent electrode according to claim 1, wherein the distribution of the scattering materials in the scattering layer has in-plane uniformity.

4. The translucent electrode according to claim 3, wherein difference between the first refractive index and the third refractive index is 0.2 or less.

5. The translucent electrode according to claim 1, wherein a surface of the scattering layer has waviness constituting a curved surface.

6. The translucent electrode according to claim 5, wherein a ratio (Ra/R$\lambda$a) between a roughness Ra of the waviness of the surface of the scattering layer and a wavelength R$\lambda$a of the waviness of the surface thereof is from $1.0 \times 10^{-3}$ to $3.0 \times 10^{-2}$.

7. The translucent electrode according to claim 1, wherein a surface roughness Ra of the surface of the scattering layer is 30 nm or less.

8. The translucent electrode according to claim 1, wherein a content of the scattering materials in the scattering layer is at least 1 vol %.

9. The translucent electrode according to claim 1, wherein the scattering materials are pores.

10. The translucent electrode according to claim 1, wherein the scattering materials are precipitated crystals of a glass constituting the base layer.

11. The translucent electrode according to claim 1, wherein the number of the scattering materials per 1 $mm^2$ of the scattering layer is at least $1 \times 10^4$.

12. The translucent electrode according to claim 1, wherein the scattering layer contains 20 to 30 mol % of $P_2O_5$, 3 to 14 mol % of $B_2O_3$, 10 to 20 mol % of $Li_2O$, $Na_2O$ and $K_2O$ in terms of total amount thereof, 10 to 20 mol % of $Bi_2O_3$, 3 to 15 mol % of $TiO_2$, 10 to 20 mol % of $Nb_2O_5$ and 5 to 15 mol % of $WO_3$.

13. A process for producing a translucent substrate comprising steps of:
preparing a translucent glass substrate,
forming on the glass substrate a scattering layer comprising:
a base material having a first refractive index for at least one wavelength of light to be transmitted; and
a plurality of scattering materials dispersed in the base material and having a second refractive index different from that of the base material, and
forming on the scattering layer a translucent electrode having a third refractive index higher than the first refractive index,
wherein the scattering layer forming step includes steps of:
applying a coating material containing a glass powder onto the glass substrate, and
firing the applied glass powder, and
wherein distribution of the scattering materials in the scattering layer decreases toward the translucent electrode in a vicinity of a surface at a translucent electrode side of the scattering layer.

14. The process for producing a translucent substrate according to claim 13, wherein the firing step includes a step of firing the glass powder at a temperature which is 40 to 60° C. higher than a glass transition temperature of the applied glass material.

15. The process for producing a translucent substrate according to claim 13, wherein the applying step includes a step of applying the glass powder having a particle size $D_{10}$ of 0.2 μm or more and $D_{90}$ of 5 μm or less.

16. An organic LED element comprising:
a translucent glass substrate;
a scattering layer formed on the glass substrate and comprising a glass which contains: a base material having a first refractive index for at least one wavelength of light to be transmitted; and a plurality of scattering materials dispersed in the base material and having a second refractive index different from that of the base material;
a translucent electrode formed on the scattering layer and having a third refractive index higher than the first refractive index;
an organic layer formed on the translucent electrode, and
a reflective electrode formed on the organic layer,
wherein distribution of the scattering materials in the scattering layer decreases toward the translucent electrode in a vicinity of a surface at a translucent electrode side of the scattering layer.

17. A process for producing an organic LED element comprising steps of:
preparing a translucent glass substrate,
forming on the glass substrate a scattering layer comprising:
a base material having a first refractive index for at least one wavelength of light to be transmitted; and
a plurality of scattering materials dispersed in the base material and having a second refractive index different from that of the base material;
forming on the scattering layer a translucent electrode having a third refractive index higher than the first refractive index;
forming an organic layer on the translucent electrode; and
forming a reflective electrode on the organic layer,
wherein distribution of the scattering materials in the scattering layer decreases toward the translucent electrode in a vicinity of a surface at a translucent electrode side of the scattering layer.

* * * * *